United States Patent
Wirz et al.

(10) Patent No.: US 12,100,661 B2
(45) Date of Patent: Sep. 24, 2024

(54) SEMICONDUCTOR DIE EDGE PROTECTION FOR SEMICONDUCTOR DEVICE ASSEMBLIES AND ASSOCIATED SYSTEMS AND METHODS

(71) Applicant: Micron Technology, Inc., Boise, ID (US)

(72) Inventors: Brandon P. Wirz, Boise, ID (US); Andrew M. Bayless, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/368,987

(22) Filed: Sep. 15, 2023

(65) Prior Publication Data

US 2024/0006320 A1 Jan. 4, 2024

Related U.S. Application Data

(62) Division of application No. 17/231,210, filed on Apr. 15, 2021, now Pat. No. 11,776,908.

(51) Int. Cl.
| | |
|---|---|
| H01L 23/48 | (2006.01) |
| H01L 21/78 | (2006.01) |
| H01L 23/31 | (2006.01) |
| H01L 23/532 | (2006.01) |
| H01L 25/00 | (2006.01) |
| H01L 25/065 | (2023.01) |

(52) U.S. Cl.
CPC ........ *H01L 23/53238* (2013.01); *H01L 21/78* (2013.01); *H01L 23/3107* (2013.01); *H01L 23/481* (2013.01); *H01L 25/0657* (2013.01); *H01L 25/50* (2013.01)

(58) Field of Classification Search
CPC .............. H01L 23/53238; H01L 21/78; H01L 23/3107

See application file for complete search history.

(56) References Cited

U.S. PATENT DOCUMENTS

| | | | |
|---|---|---|---|
| 9,679,882 B2 | 6/2017 | Tung et al. | |
| 11,127,728 B2 | 9/2021 | Zhou et al. | |
| 11,456,257 B2 | 9/2022 | Jeng et al. | |
| 11,731,869 B1* | 8/2023 | Grosjean | ............ B81C 1/00285 257/415 |
| 2014/0151895 A1 | 6/2014 | West et al. | |
| 2016/0276235 A1 | 9/2016 | Chen | |
| 2017/0179030 A1 | 6/2017 | Tseng et al. | |

(Continued)

*Primary Examiner* — Thao P Le
(74) *Attorney, Agent, or Firm* — Perkins Coie LLP

(57) ABSTRACT

Semiconductor dies with edges protected and methods for generating the semiconductor dies are disclosed. Further, the disclosed methods provide for separating the semiconductor dies without using a dicing technique. In one embodiment, trenches are formed on a front side of a substrate including semiconductor dies. Individual trenches correspond to scribe lines of the substrate where each trench has a depth greater than a final thickness of the semiconductor dies. A composite layer may be formed on sidewalls of the trenches to protect the edges of the semiconductor dies. The composite layer includes a metallic layer that shields the semiconductor dies from electromagnetic interference. Subsequently, the substrate may be thinned from a back side to singulate individual semiconductor dies from the substrate.

14 Claims, 13 Drawing Sheets

(56) References Cited

U.S. PATENT DOCUMENTS

| | | | |
|---|---|---|---|
| 2020/0169065 A1* | 5/2020 | Carson | H01S 5/18327 |
| 2020/0219772 A1 | 7/2020 | Ramaswamy et al. | |
| 2021/0035965 A1 | 2/2021 | Mizutani et al. | |
| 2022/0084981 A1* | 3/2022 | Verdugo | B23K 1/0016 |
| 2022/0336280 A1 | 10/2022 | Wirz et al. | |
| 2022/0336366 A1 | 10/2022 | Wirz et al. | |
| 2023/0028561 A1* | 1/2023 | Wu | H01L 27/1225 |
| 2023/0069031 A1 | 3/2023 | Wu et al. | |
| 2024/0006352 A1* | 1/2024 | Li | H01L 24/06 |
| 2024/0162163 A1* | 5/2024 | Koduri | H01L 24/11 |

\* cited by examiner

SEMICONDUCTOR DIE EDGE PROTECTION FOR SEMICONDUCTOR DEVICE ASSEMBLIES AND ASSOCIATED SYSTEMS AND METHODS

CROSS-REFERENCE TO RELATED APPLICATION(S)

This application is a division of U.S. application Ser. No. 17/231,210, filed Apr. 15, 2021, which is incorporated herein by reference in its entirety.

TECHNICAL FIELD

The present disclosure generally relates to semiconductor device assemblies, and more particularly relates to semiconductor die edge protection for semiconductor device assemblies and associated systems and methods.

BACKGROUND

Semiconductor packages typically include one or more semiconductor dies (e.g., memory chip, microprocessor chip, imager chip) mounted on a substrate, encased in a protective covering. The semiconductor dies may include functional features, such as memory cells, processor circuits, or imager devices, as well as bond pads electrically connected to the functional features. The bond pads can be electrically connected to corresponding conductive structures of the substrate, which may be coupled to terminals outside the protective covering such that the semiconductor die can be connected to higher level circuitry.

In some semiconductor packages, two or more semiconductor dies may be stacked on top of each other to reduce footprints of the semiconductor packages (which may be referred to as multi-chip packages). The stacked semiconductor dies may include three-dimensional interconnects (e.g., through-silicon vias (TSVs)) to route electrical signals between the semiconductor dies. The semiconductor dies may be thinned to reduce overall thicknesses of such semiconductor packages, as well as to mitigate issues related to forming the three-dimensional interconnects through the stacked semiconductor dies. Typically, a carrier wafer is attached to a front side of a substrate (e.g., a wafer) having the semiconductor dies fabricated thereon such that the substrate may be thinned from its back side. Further, the substrate may be diced to singulate individual semiconductor dies while attached to an adhesive layer of a sheet of mount tape. The dicing step, however, tends to generate particles that cause yield loss. Further, the dicing step utilizing a blade may be incompatible with new advanced materials included in the semiconductor dies.

BRIEF DESCRIPTION OF THE DRAWINGS

Many aspects of the present disclosure can be better understood with reference to the following drawings. The components in the drawings are not necessarily to scale. Instead, emphasis is placed on illustrating clearly the principles of the present disclosure and overall features.

DETAILED DESCRIPTION

Figure 1A:
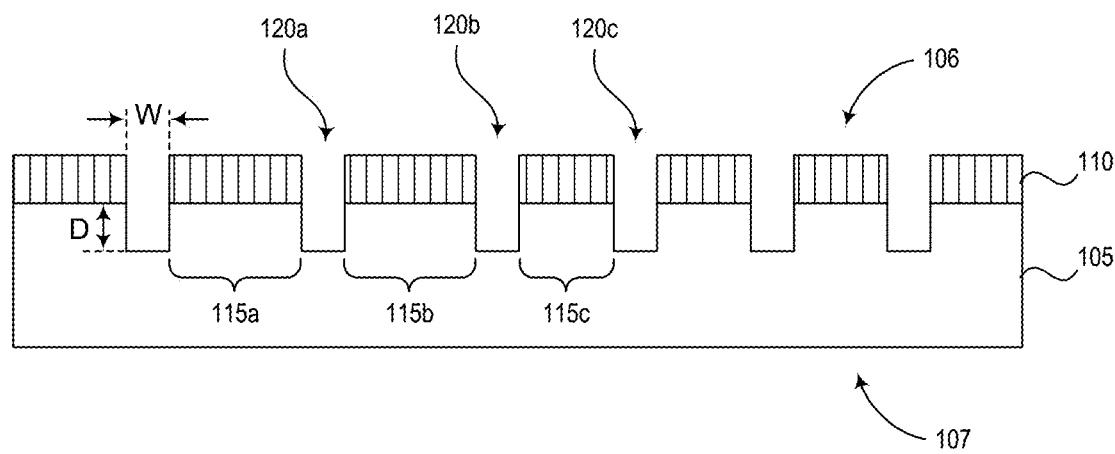
FIGS. 1A through 1O illustrate aspects of a process for semiconductor die edge protection and associated semiconductor die assemblies in accordance with embodiments of the present disclosure.

Specific details of embodiments for protecting edges of semiconductor dies, semiconductor device assemblies including the semiconductor dies, and associated systems and methods are described below. The schemes of protecting edges of semiconductor dies not only provide for protective layers around edges (sidewalls) of the semiconductor dies but also enable alternative die separation techniques (e.g., compared to conventional dicing techniques) suitable for reducing particles, integrating new materials, and/or deploying advanced packaging technology. For example, the protective layers around the sidewalls of semiconductor dies are expected to reduce cracks (or chipping) at the edges or propagation of such cracks inward toward integrated circuits and/or various components of the semiconductor dies. Further, the alternative die separation techniques can provide for clear edges of the semiconductor dies such that bond line thicknesses can be accurately estimated for bonding the semiconductor dies utilizing a thermal compression bonding (TCB) process.

As described in more detail herein, the protective layers include metallic layers (e.g., a layer of a metal, such as copper; a metal layer). The metallic layers can shield the semiconductor dies from electromagnetic interference (EMI)—e.g., for transmitting/receiving signals with superior quality. Further, the metallic layers can be magnetized to facilitate transferring the semiconductor dies from source wafers and aligning the semiconductor dies to receiving wafers—e.g., non-contact die transfers to avoid contaminating plasma-treated die surfaces. In some cases, the metallic layers can assist heat transfers throughout the semiconductor dies—e.g., during the TCB process or during operation of the semiconductor dies. In some embodiments, the protective layers may include diffusion barriers (e.g., a layer of nitride) to block contaminants (e.g., metallic atoms such as copper from the metallic layer) from migrating into the semiconductor dies, which may cause reliability issues.

The die separation techniques in accordance with the present disclosure mitigate various risks associated with conventional dicing steps (e.g., blade dicing, laser dicing), which tend to generate particles that easily attach to the surface of the semiconductor dies causing yield and/or reliability issues. The conventional dicing steps also present challenges for integrating new materials (e.g., low-k and/or extreme low-k materials) used to build state-of-the-art semiconductor devices. In some cases, the conventional dicing steps may leave contaminants on the surface of the semiconductor dies, which, in return, may hinder deploying advanced packaging techniques—e.g., a combination bonding technique that forms direct bonding between two semiconductor dies, which may also be referred to as a hybrid bonding technique. Further, the die separation techniques can reduce widths of dicing lanes such that more semiconductor dies may be generated per wafer—e.g., reducing a production cost.

The term "semiconductor device or die" generally refers to a solid-state device that includes one or more semiconductor materials. Examples of semiconductor devices include logic devices, memory devices, microprocessors, or diodes, among others. Such semiconductor devices may include integrated circuits or components, data storage elements, processing components, and/or other features manufactured on semiconductor substrates. Further, the term "semiconductor device or die" can refer to a finished device or to an assembly or other structure at various stages of processing before becoming a finished device. Depending upon the context in which it is used, the term "substrate" can refer to a wafer-level substrate or to a singulated, die-level substrate. Also, a substrate may include a semiconductor wafer, a package support substrate, an interposer, a semiconductor device or die, or the like. Moreover, various suitable steps of the methods described herein can be performed at the wafer level or at the die level.

Further, unless the context indicates otherwise, structures disclosed herein can be formed using conventional semiconductor-manufacturing techniques. Materials can be deposited, for example, using chemical vapor deposition (CVD), physical vapor deposition (PVD), atomic layer deposition (ALD), spin coating, plating, and/or other suitable techniques. Similarly, materials can be removed, for example, using plasma etching, wet etching, back grinding, chemical-mechanical planarization (CMP), or other suitable techniques. Some of the techniques may be combined with photolithography processes. The present disclosure may be implemented in additional embodiments, and the present disclosure may be practiced without several of the details of the embodiments described herein with reference to FIGS. 1A through 5.

As used herein, the terms "front," "back," "vertical," "lateral," "top," "bottom," "down," "up," "upper," and "lower" can refer to relative directions or positions of features in the semiconductor device assemblies in view of the orientation shown in the Figures. For example, "upper" or "uppermost" can refer to a feature positioned closer to the top of a page than another feature. These terms, however, should be construed broadly to include semiconductor devices having other orientations. The present disclosure may have additional embodiments, and that the technology may be practiced without several of the details of the embodiments described herein with reference to FIGS. 1A through 5.

FIG. 1A illustrates a cross-sectional diagram of a semiconductor substrate 105 that includes semiconductor dies 115 (also identified individually as 115a through 115c) on a front side 106 of the substrate 105. Each semiconductor die 115 includes integrated circuitry formed on its front side (which corresponds to the front side 106 of the substrate 105). Further, the semiconductor die 115 may include one or more vias (which may also be referred to as through-silicon vias or through-substrate vias (TSVs)) coupled to the integrated circuitry (as depicted in FIGS. 1G, 1H, 1I, 1L, and 1M), and extending from the front side 106 toward a back side 107 of the substrate 105. In some embodiments, the semiconductor dies include memory dies (e.g., SRAM, DRAM, flash, 3D NAND, 3D cross-point and/or other memory devices). The integrated circuitry and the TSVs are omitted when multiple semiconductor dies 115 are depicted in FIGS. 1A-1L in a relatively low magnification for clear illustration of certain aspects of the principles of the present disclosure.

FIG. 1A also depicts a set of trenches 120 (also identified individually as 120a through 120c) formed on the front side 106, as well as a photo resist layer 110 used to protect the semiconductor dies 115 during the process steps forming the trenches 120. Individual trenches 120 may correspond to scribe lines (dicing lanes or dicing streets) of the substrate 105. In some embodiments, the trenches 120 may be formed prior to bumping process steps (e.g., process steps for plating conductive pillars for the TCB process). In some embodiments, the photo resist layer 110 can include a hard mask layer (e.g., a hard mask with carbon). In some embodiments, forming the trenches 120 may be accomplished by performing an etch process (e.g., plasma-based dry etch process, wet etch process) known to a person skilled in the art of semiconductor fabrication technology. Although the trenches 120 are depicted to include vertical sidewalls, in some embodiments, the sidewalls of the trenches 120 may be sloped. For example, openings of the trenches 120 may be greater at the surface of the substrate 105 than those at the bottom of the trenches 120—e.g., sidewalls with a positive slope. The positive slope of the sidewalls may facilitate formation of relatively uniform protective layers on the sidewalls.

Dimensions of the trenches 120 include a width (denoted as "W" in FIG. 1A) and a depth D (denoted as "D" in FIG. 1A). The width of the trenches 120 may be less than typical widths of dicing lanes (scribe lines), which may be approximately 60 to 80 μm wide (e.g., within 10% of 60 μm, within 10% of 80 μm). In some embodiments, the width of trenches 120 may be approximately 40 μm (e.g., within 10% of 40 μm), 30 μm (e.g., within 10% of 30 μm), or even less. Further, the depth of trenches 120 can be determined based on a final thickness of the semiconductor dies 115 (denoted as "T" in FIG. 1G). Namely, the depth of trenches 120 may be devised to be greater than the final thickness of the semiconductor dies 115 such that individual semiconductor dies 115 can be singulated (separated) without a dicing process as described herein. For example, when the final thickness of the semiconductor dies 115 is approximately 50 μm (e.g., within 10% of 50 μm), the depth of trenches 120 may be approximately 55 to 60 μm (e.g., within 10% of 55 μm, within 10% of 60 μm). Additionally, or alternatively, the width and depth of the trenches 120 may be based on the aspect ratio of the trenches 120 in view of the process capability associated with downstream process steps, such as process steps forming one or more layers on the sidewalls of the trenches 120 and/or filling the trenches 120 with an adhesive material, among others.

Figure 1B:
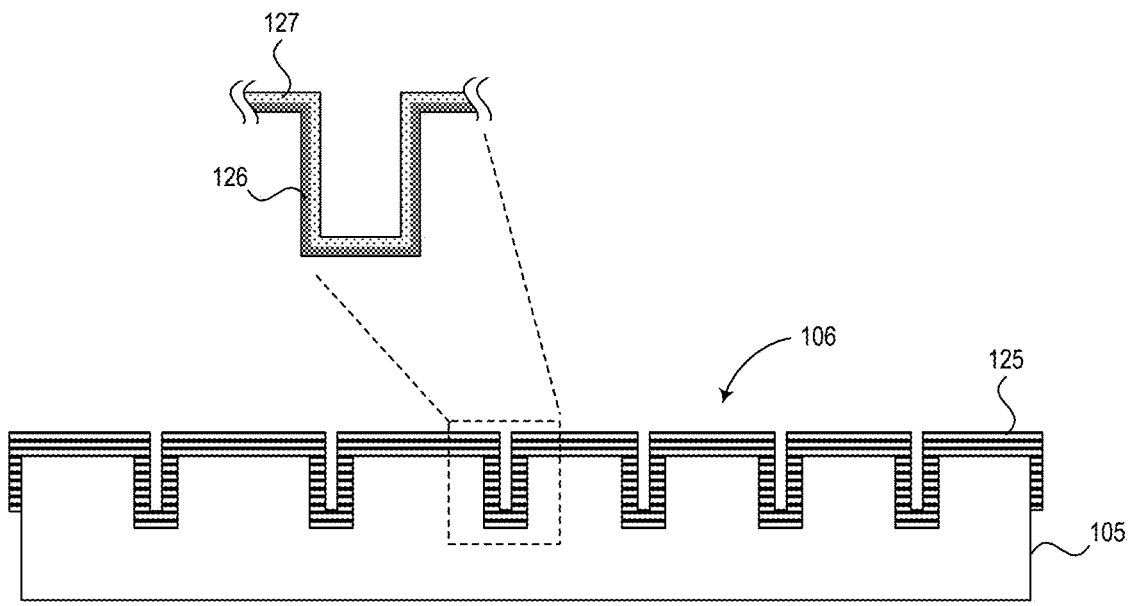

FIG. 1B illustrates a cross-sectional diagram of the substrate 105 after the photo resist layer 110 has been removed, and subsequently, a composite layer 125 (e.g., a protective layer) has been formed on the sidewalls of the trenches 120 and the front side 106 of the substrate 105. The composite layer 125 can be formed by performing one or more process steps, such as ALD process, CVD process, PVD process, and/or plating process steps. In a particular aspect of an embodiment shown in FIG. 1B, the composite layer 125 includes a diffusion barrier 126 and a metallic layer 127. In some embodiments, the metallic layer 127 includes copper (Cu), tungsten (W), nickel (Ni), or the like. Further, the diffusion barrier 126 can be configured to block one or more metallic constituents (e.g., copper having a relatively high diffusion coefficient in the substrate 105) of the metallic layer 127 from diffusing into the substrate 105. In some embodiments, the diffusion barrier 126 includes at least one of silicon nitride, tantalum, or tantalum nitride. In some embodiments, the composite layer 125 include a buffer layer (not shown) between the substrate 105 and the diffusion barrier 126—e.g., an oxide layer, an oxynitride layer, or a combination thereof. Such a buffer layer may reduce formation of defects (e.g., crystalline defects) in the substrate 105. In some embodiments, the diffusion barrier 126 can be omitted—e.g., if the metallic constituents have relatively low diffusion coefficients (e.g., tungsten, nickel) in the substrate 105.

Figure 1C:
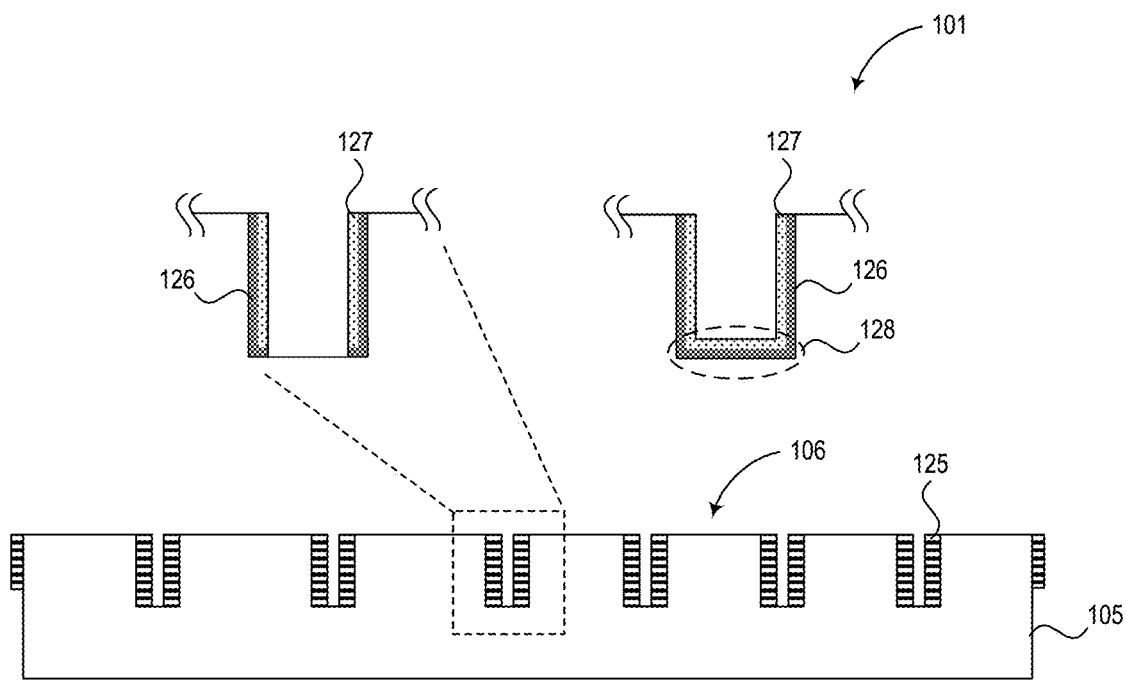

FIG. 1C illustrates a cross-sectional diagram of the substrate 105, after the composite layer 125 has been removed from the front side 106 of the substrate 105, and from the bottom of the individual trenches 120. As a result, the composite layer 125 remains on the sidewalls of the trenches 120. In some embodiments, an etch process (e.g., plasma-based dry etch process) may be performed to remove the composite layer 125 from relatively flat regions (e.g., the front side 106, the bottom of the trenches 120) with respect to incoming flux of etchants, while retaining the composite layer 125 on the sidewalls. In other embodiments, a CMP process may be used to remove the composite layer 125 from the front side 106 of the substrate 105. In such embodiments, portions 128 of the composite layer 125 remain at the bottom of the trenches 120 as illustrated in a cross-sectional diagram 101 of FIG. 1C highlighting one of such trenches 120. The portions 128 can be removed during subsequent process steps, for example, when the TSVs are exposed from the back side of the substrate 105 as described herein with reference to FIGS. 1H and 1I.

Figure 1D:
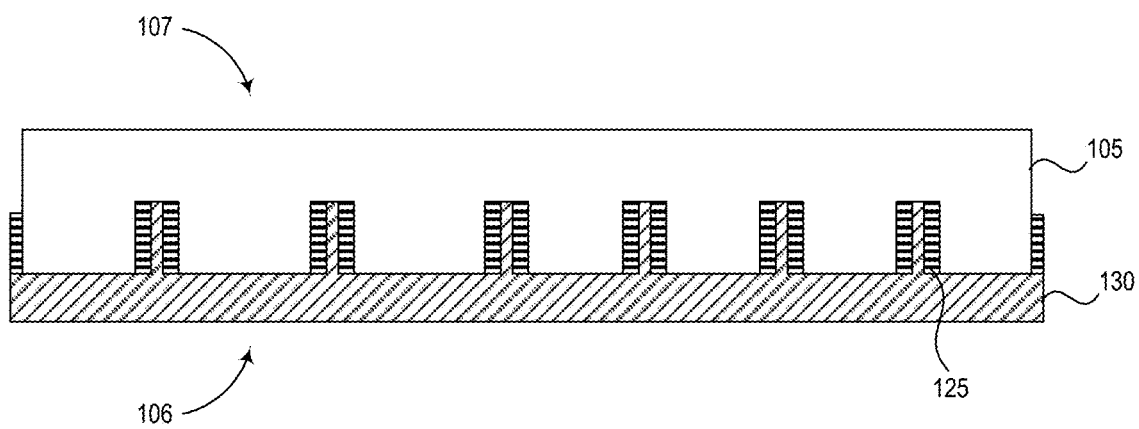

FIG. 1D illustrates a cross-sectional diagram of the substrate 105, after the trenches 120 (with the composite layer 125 formed on their sidewalls) has been filled with an adhesive material 130—e.g., Nissan Chemical thermoset adhesive. The adhesive material 130 (which may be referred to as a carrier adhesive) also covers (e.g., coats) the front side 106 of the substrate 105. The sidewalls of the trenches 120 are protected by the composite layer 125 to prevent the adhesive material 130 directly contacting the sidewalls. In some embodiments, the adhesive material 130 may exhibit a fluid-like material property such that the trenches 120 with a high aspect ratio (e.g., a relatively narrow opening with a relatively deep trench bottom) can be filled. Further, the substrate 105 in FIG. 1D has been flipped to depict the back side 107 above the front side 106.

Figure 1E:
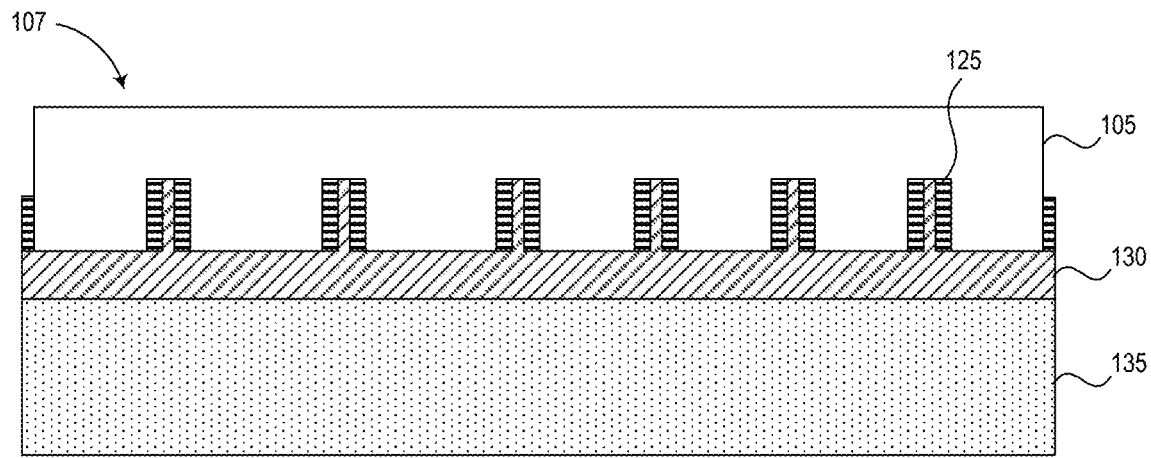

FIG. 1E illustrates a cross-sectional diagram of the substrate 105, after a carrier substrate 135 (or a support substrate) has been bonded using the adhesive material 130 on the front side 106. The carrier substrate 135 may mechanically support the substrate 105 (and the semiconductor dies 115 thereof) during subsequent process steps to be performed on the back side 107—e.g., process steps described with reference to FIGS. 1F through 1J. Further, the adhesive material 130 can be densified (e.g., set, cured) such that the adhesive material 130 becomes suitable for the subsequent processing steps. In some embodiments, a thermal process may be applied to the adhesive material 130 (e.g., thermally setting the adhesive material 130). Additionally, or alternatively, a chemical process may be applied to the adhesive material 130 (e.g., chemically setting the adhesive material 130).

Figure 1F:
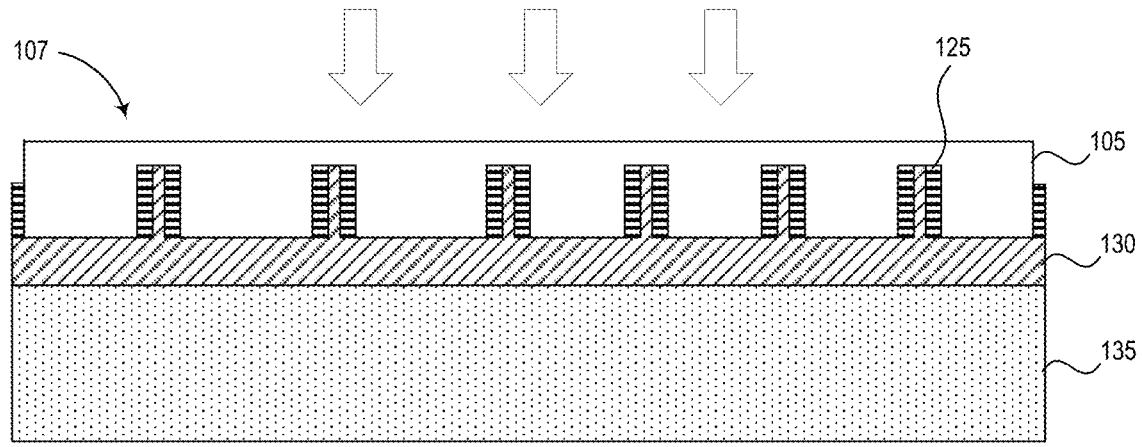

FIG. 1F illustrates a cross-sectional diagram of the substrate 105, after a portion of the substrate 105 has been removed from the back side 107 of the substrate 105 (as indicated with arrows). In some embodiments, a back grind and/or a CMP process (e.g., a first process) may be performed to remove the bulk of the substrate 105—e.g., thinning the substrate 105 from approximately 775 μm (e.g., within 10% of 775 μm) to approximately 100 μm (e.g., within 10% of 100 μm) or less. In other embodiments, a different process (e.g., an etch process) may be performed to remove the bulk of the substrate 105, which a person skilled in the art of semiconductor fabrication may be familiar with.

Figure 1G:
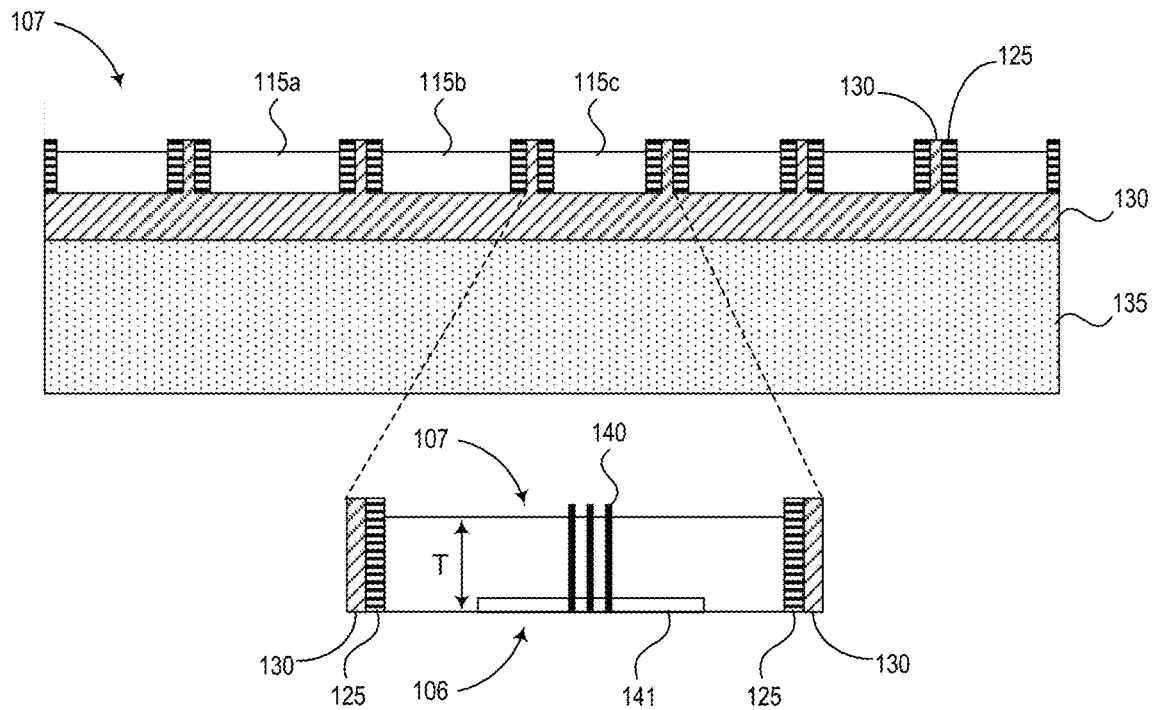

FIG. 1G illustrates a cross-sectional diagram of the substrate 105, after additional portions of the substrate 105 have been removed from the back side 107 of the substrate 105 (which corresponds to back sides of the semiconductor dies 115 at this stage of process). In some embodiments, an etch process (e.g., a second process) may be performed to the back side 107 after the bulk of the substrate 105 has been removed (e.g., using the back grind and/or CMP process described with reference to FIG. 1F). The etch process may be configured to expose the adhesive material 130 in the trenches 120 from the back side 107 as a result of removing the additional portions of the substrate 105. If the portions 128 of the composite layer 125 remain at the bottom of the trenches 120 as illustrated in the alternative cross-sectional diagram 101 of FIG. 1C, the etch process would expose the portions 128 of the composite layer 125 to subsequent process steps—e.g., the CMP process that exposes the TSVs at the back side 107 as described with reference to FIGS. 1H and 1I.

Further, the etch process may be devised to expose one or more TSVs 140 of the semiconductor dies 115 from the back side 107. The TSVs 140 are coupled to the integrated circuitry 141, and configured to provide electrical connections for the integrated circuitry 141 at the back side 107 of the semiconductor dies 115—e.g., to facilitate stacking of multiple semiconductor dies 115 on top of each other. In some embodiments, the back side 107 of the semiconductor dies 115 may be recessed with respect to the exposed adhesive material 130 after removing the additional portions of the substrate 105. As such, the second process (e.g., the etch process) may be configured to remove the semiconductor substrate 105 at a first removal rate and the adhesive material 130 (and/or the composite layer 125) at a second removal rate that is less than the first removal rate.

It should be appreciated that, after completing the second process to expose the adhesive material 130 in the trenches 120 from the back side 107 (e.g., when the etch front proceeds past the bottom of trenches 120 from the back side 107), the semiconductor dies 115 are separated from the substrate 105 because the depth of the trenches 120 is determined to be greater than the final thickness of the semiconductor dies 115—e.g., the thickness (denoted as T in FIG. 1G) of the semiconductor dies 115 at the completion of the etch process. In other words, individual semiconductor dies 115 are separated from the substrate 105 because the substrate 105 common to all semiconductor dies 115 no longer exist as a result of completing the second process (e.g., the etch process). Thereafter, individual semiconductor dies 115 are held to each other and to the carrier substrate 135 by the adhesive material 130. In this manner, a combination of forming trenches 120 on the front side 106 of the substrate 105 and thinning the substrate 105 from the back side 107 past the bottom of the trenches 120 accomplishes separating (singulating) the semiconductor dies 115 from the substrate 105, thereby eliminating dicing steps that physically sever the semiconductor dies 115 from the substrate 105.

Still referring to FIG. 1G, as the substrate 105 common to the semiconductor dies 115 no longer exists and the semiconductor dies 115 are coupled with each other by the adhesive material 130, a warpage of the substrate 105 may be avoided (or at least reduced) during the subsequent process steps performed on the back side 107 of the semiconductor dies 115. In other words, mechanical pressure (or force) that may be exerted on the semiconductor dies 115 during the wafer back side processing steps may be at least partially absorbed by the adhesive material 130 placed between the semiconductor dies 115 in lieu of subjecting the substrate 105 to the stress that may generate defects (e.g., slippage, crystalline dislocations) in the substrate 105—e.g., during de-bonding step.

As described herein, various process steps associated with forming trenches 120 filled with the adhesive material 130 and the composite layer 125, and thinning the substrate 105 from the back side 107 of the substrate 105 include conventional semiconductor process steps that may be performed in semiconductor fabrication environments (e.g., a clean room environment). The clean room process steps are inherently cleaner than a conventional dicing process involving mechanical dicing of the substrate 105. Thus, the semiconductor dies 115 separated from the substrate 105 in accordance with the present disclosure may benefit from the clean room process steps, such as reduced particles, debris, contaminants, damages, cracks, or the like, to improve yield and reliability of the semiconductor dies 115 (or semiconductor device assemblies including the semiconductor dies 115). Moreover, the final thickness of the semiconductor dies 115 may be thinner than that of the semiconductor dies 115 separated by the conventional dicing process—e.g., the semiconductor dies 115 may not have to maintain a certain thickness to sustain various forces during the dicing process. Thinner semiconductor dies 115 would reduce overall package heights and/or facilitate utilizing an advanced packaging technique (e.g., combination bonding) for the semiconductor dies 115.

Further, when compared with a dicing technique, the clean room process steps may be more compatible with integrating new materials (e.g., low-k dielectric material, extreme low-k dielectric material) that may be essential for advanced semiconductor devices. Additionally, the present disclosure may reduce a production cost of the semiconductor dies 115 because of the nature of wafer level processes that concurrently separates all the semiconductor dies 115 from the substrate 105, instead of having a saw cutting a row (or a column) of semiconductor dies 115, one row (or column) at a time. Other benefits of the present disclosure may include a flexible placement of the semiconductor dies 115 on the substrate 105 (which may be referred to as a wafer map of semiconductor dies) to increase a total quantity of semiconductor dies as the trenches 120 are not required to form straight lines (as in dicing lanes). For example, one or more rows (or columns) of semiconductor dies 115 may be shifted with respect to neighboring rows (or columns) of semiconductor dies 115 such that a quantity of partial dies around the perimeter of the wafer may be reduced. Moreover, the present disclosure may facilitate variations in shapes and sizes of the semiconductor dies 115 within a semiconductor wafer. For example, individual semiconductor dies 115 may be in a hexagonal shape (or different shapes other than conventional rectangular shape)—e.g., the hexagonal shape may increase a total quantity of memory dies that can be placed in a semiconductor wafer or provide an efficient layout of various components within the semiconductor dies 115.

Figure 1H:
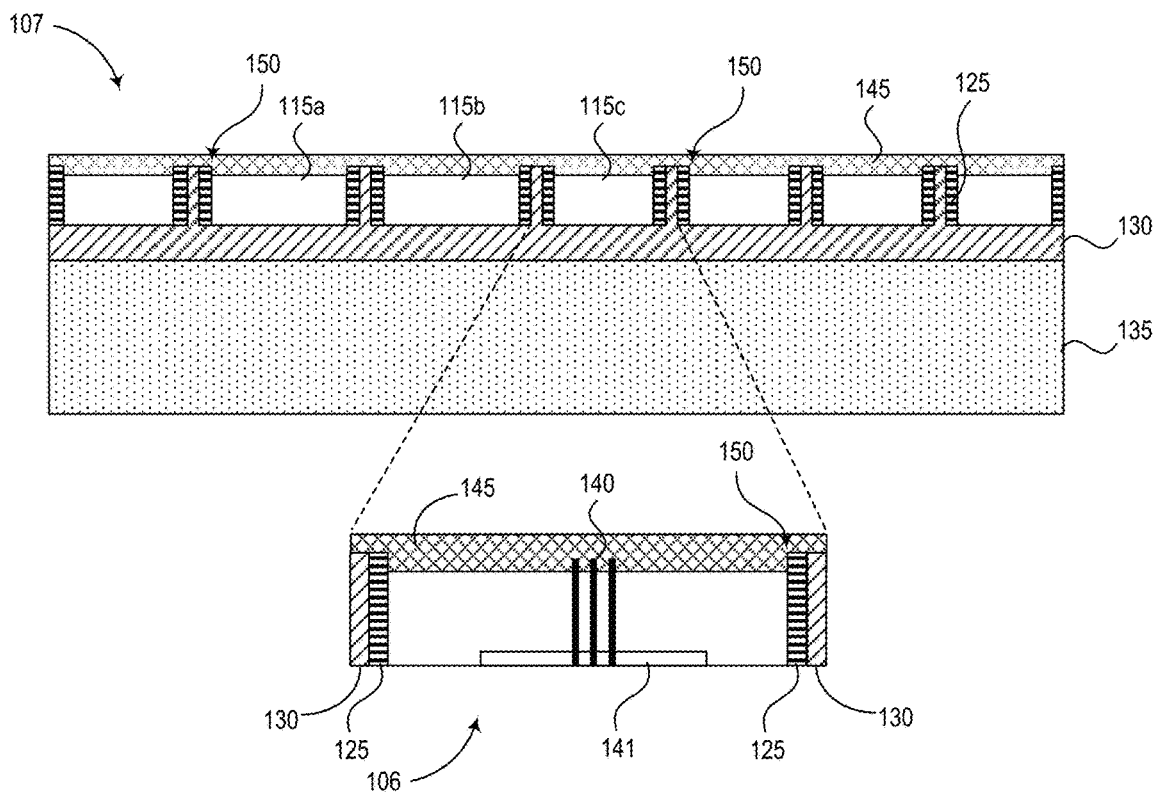

FIG. 1H illustrates a cross-sectional diagram of the semiconductor dies 115 attached to the carrier substrate 135, after a dielectric layer 145 has been formed on the back side 107.

The dielectric layer 145 can be formed by performing one or more process steps, such as deposition processes (e.g., CVD and/or PVD processes) described with reference to FIG. 1B. The dielectric layer 145 may include various dielectric materials, such as an oxide, a nitride, an oxynitride, or a combination thereof. In some example embodiments, the dielectric layer 145 may include a composite layer having a nitride and an oxide formed at a relatively low temperature (which may be referred to as low temperature nitride and oxide (LTNO)). In other example embodiments, the dielectric layer 145 may include a silicon nitride (SiN) layer and/or a layer of tetraethyl orthosilicate (TEOS). The dielectric layer 145 may protect the back side 107 of individual semiconductor dies 115 from contaminants (e.g., copper) and/or during subsequent processing steps—e.g., one or more cleaning steps to remove the adhesive material 130, forming conductive components (e.g., under-bump metallization (UBM) structures for the TSVs 140). After forming the dielectric layer 145, the TSVs 140 may be buried within the dielectric layer 145. Further, an interface 150 may form between the dielectric layer 145 and the composite layer 125.

Figure 1I:
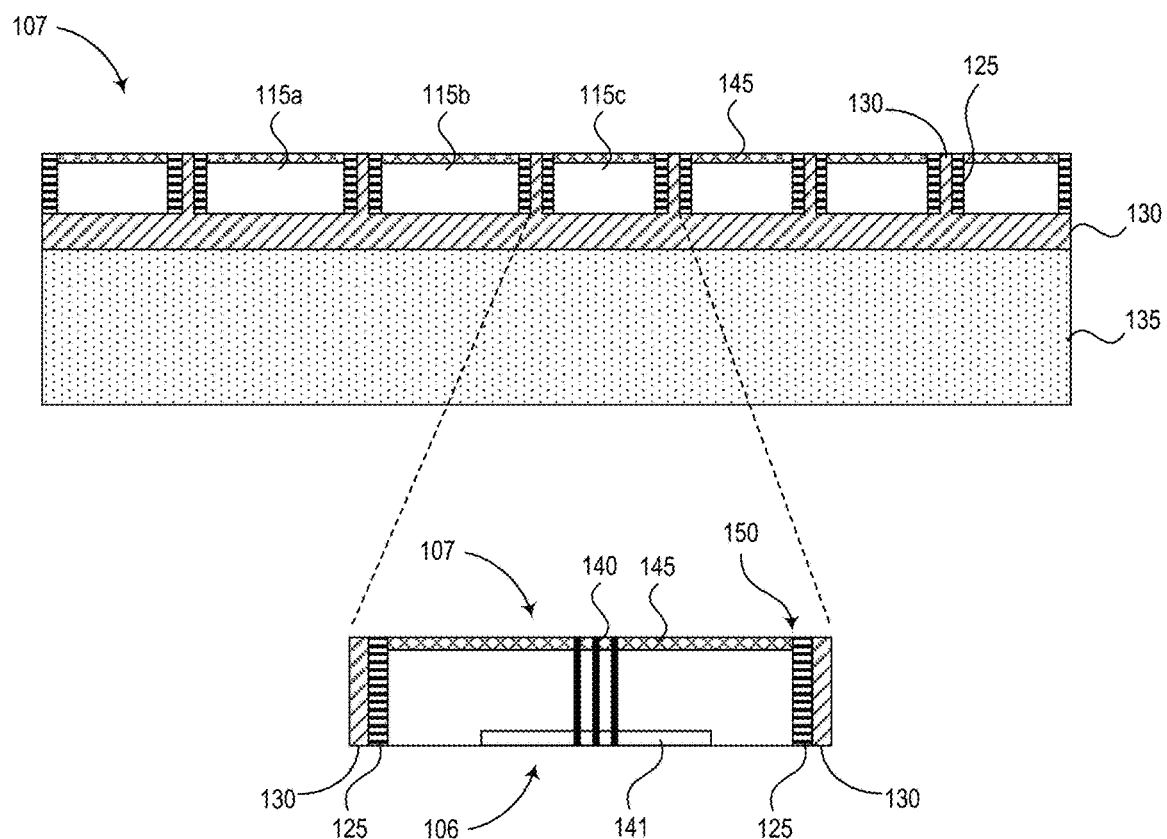

FIG. 1I illustrates a cross-sectional diagram of the semiconductor dies 115 attached to the carrier substrate 135, after a portion of the dielectric layer 145 has been removed to expose the TSVs 140 of the semiconductor dies 115. In some embodiments, a CMP process may be performed to remove the portion of the dielectric layer 145 to expose the TSVs 140 of the semiconductor dies 115 from the back side 107 (which corresponds to the surface of the dielectric layer 145 that has been polished at this stage of process). In other embodiments, an etch process may be performed to remove the portion of the dielectric layer 145 to expose the TSVs 140 of the semiconductor dies 115. The interface 150 between the composite layer 125 and the dielectric layer 145 would remain after the CMP process step (or the etch process step). If the portions 128 of the composite layer 125 remain at the bottom of the trenches 120 as illustrated in the alternative cross-sectional diagram 101 of FIG. 1C, the CMP process that removes the portion of the dielectric layer 145 to expose the TSVs 140 would also remove the portions 128 of the composite layer 125 such that the semiconductor dies 115 are separated from each other—e.g., singulated.

In some embodiments, after exposing the TSVs 140 on the surface of the dielectric layer 145, one or more process steps may be performed to form conductive components on the back side 107 of the semiconductor dies 115—e.g., UBM structures corresponding to the TSVs 140 to facilitate stacking of the semiconductor dies 115. Such process steps may include additional deposition process steps (e.g., forming one or more metallic/conductive layers), photolithography process steps (e.g., defining UBM structures corresponding to the TSVs 140), etch process steps (e.g., removing excessive metallic/conductive materials where unnecessary), clean process steps (e.g., removing photo resists, removing various by-products generated during etch process steps), among others. The adhesive material 130, once cured (e.g., thermally set as described with reference to FIG. 1E), may exhibit material properties (e.g., modulus of rigidity) sufficient to sustain its structural and/or compositional integrity during the process steps—e.g., remaining within the trenches 120. The adhesive material 130, however, may be removed using a specific solvent that selectively dissolves the adhesive material 130—e.g., after having been cured.

Figure 1J:
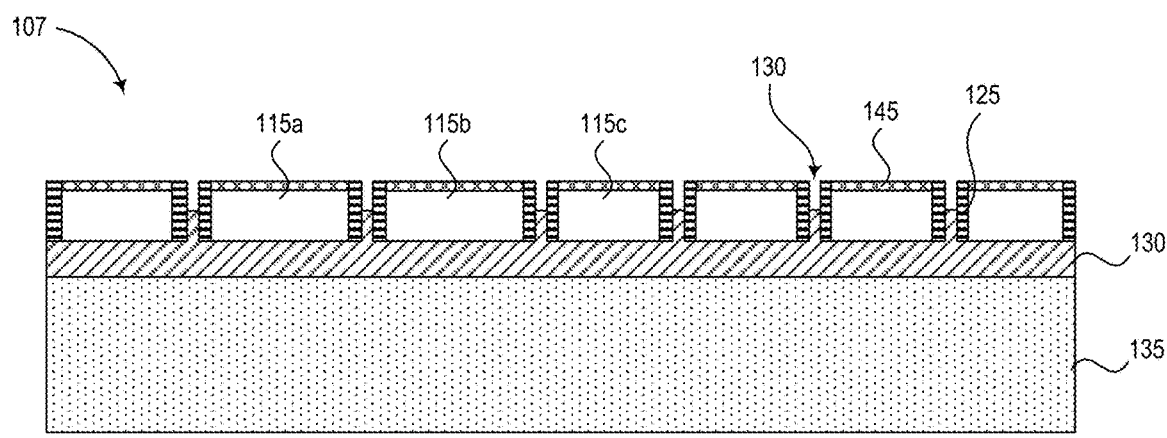

FIG. 1J illustrates a cross-sectional diagram of the semiconductor dies 115 attached to the carrier substrate 135, after the adhesive material 130 within the trenches 120 has been partially removed from the back side 107 using a cleaning process (e.g., using the specific solvent that dissolves the adhesive material 130). Removing the portion of the adhesive material 130 at this stage facilitates completely removing the adhesive material 130 from the trenches 120 as described with reference to FIG. 1L. In some embodiments, this cleaning step may be omitted.

Figure 1K:
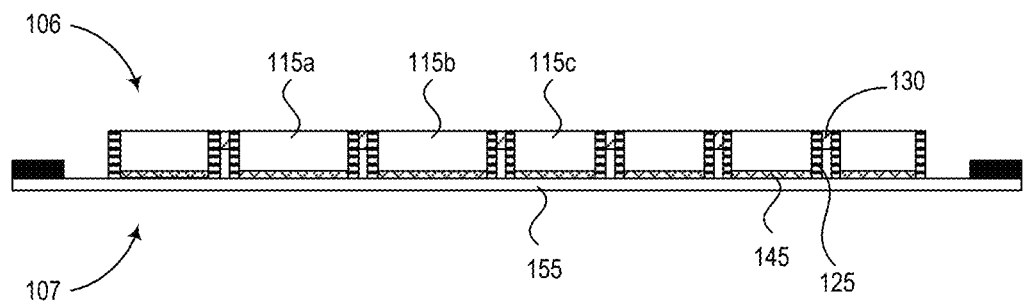

FIG. 1K illustrates a cross-sectional diagram of the semiconductor dies 115 attached to a sheet of film frame 155, after the carrier substrate 135 has been detached (de-bonded) from the semiconductor dies 115 (e.g., by removing the adhesive material 130 between the carrier substrate 135 and the semiconductor dies 115). Further, the semiconductor dies 115 in FIG. 1K has been flipped to depict the front side 106 above the back side 107. FIG. 1K also depicts remaining adhesive material 130 within the trenches 120, which holds the semiconductor dies 115 together.

Figure 1L:
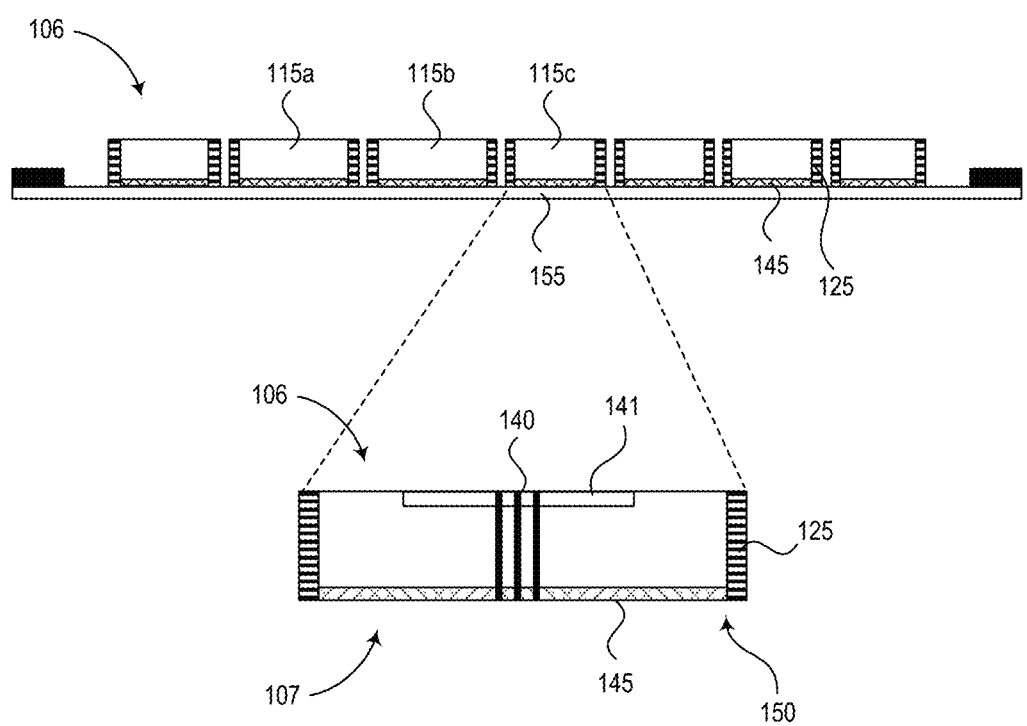

FIG. 1L illustrates a cross-sectional diagram of the semiconductor dies 115 attached to the sheet of film frame 155, after the adhesive material 130 in the trenches 120 has been removed. Subsequently, individual dies 115 may be tested for their functionality and picked up from the sheet of film frame 155 for further processing—e.g., stacking multiple semiconductor dies 115 to form semiconductor die assemblies described with reference to FIGS. 1O, 2E, and 3D.

Figure 1M:
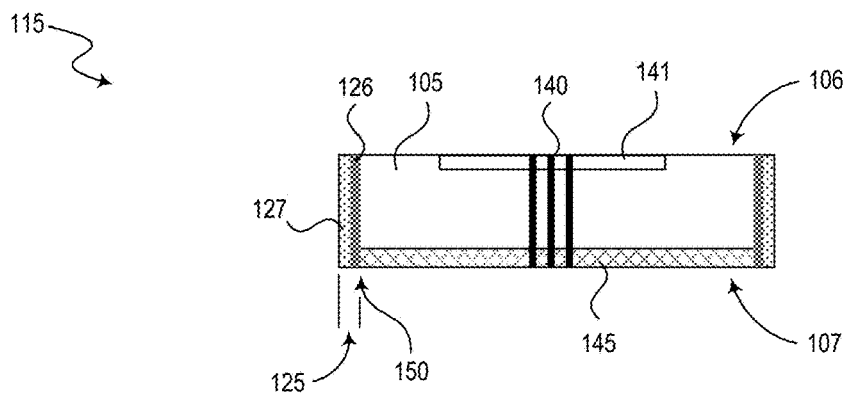

FIG. 1M is a cross-sectional diagram of the semiconductor die 115 separated from the sheet of film frame 155. The semiconductor die 115 includes the integrated circuitry 141 at the front side 106 of the semiconductor die 115 and the dielectric layer 145 at the back side 107 opposite to the front side 106. The semiconductor die 115 also includes the metallic layer 127 at the sidewall (e.g., outer edges, the outermost sidewall) of the semiconductor die 115. The metallic layer 127 extends from the front side 106 to the back side 107. Further, the metallic layer 127 surrounds the sidewall of the semiconductor die 115 such that the metallic layer 127 completely covers the sidewall—e.g., from the front side 106 to the back side 107, as well as from end to end of the outer edges although the cross-sectional diagram of FIG. 1M depicts only two cross-sections of the metallic layer 127.

In some embodiments, the semiconductor die 115 includes the diffusion barrier 126 at the sidewall such that the metallic layer 127 is not in direct contact with the substrate 105 of the semiconductor die 115. In other words, the diffusion barrier 126 has a first surface directly contacting the substrate 105 of the semiconductor die 115, and a second surface opposite to the first surface, which is in direct contact with the metallic layer 127. The diffusion barrier 126 may be configured to block one or more metallic constituents (e.g., copper) of the metallic layer 127—e.g., from diffusing into the semiconductor substrate 105. In some embodiments, the diffusion barrier 126 comprises at least one of silicon nitride, tantalum, or tantalum nitride. In some embodiments, the semiconductor die 115 also includes one or more vias 140 (e.g., TSVs) coupled to the integrated circuitry 141. The vias 140 extend from the front side 106 to the back side 107 such that the vias 140 can provide electrical connection for the integrated circuitry 141 at the back side 107.

Figure 1N:
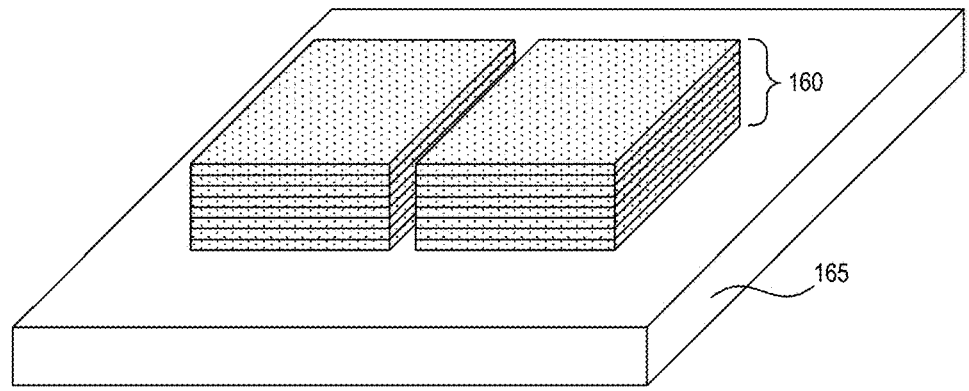

FIG. 1N illustrates stacks 160 of the semiconductor dies 115 formed on an interface substrate 165. In some embodiments, the interface substrate 165 corresponds to a semiconductor wafer including a plurality of logic dies (e.g., controller dies) that each corresponds to one of the stacks 160. In other embodiments, the interface substrate 165 corresponds to an interposer including a plurality of interposer dies that each corresponds to one of the stacks 160. The interposer dies can be configured to route electrical signals to and/or from the stacks 160.

In some embodiments, a TCB process can be used to form the stacks 160, which utilizes intermediary structures to bond the semiconductor dies 115 to each other—e.g., using conductive interconnects including conductive pillars coupled to conductive pads through solder material. In such embodiments, individual metallic layers 127 of the semiconductor dies 115 are not connected to each other. Namely, adjacent metallic layers 127 of the semiconductor dies 115 are separated by a gap. In some embodiments, the gap correspond to a height of the conductive interconnects, which may vary between approximately 10 μm to 20 μm. In some embodiments, the gap may be less than 10 μm.

In some embodiments, a combination bonding process (e.g., a hybrid bonding technique, a direct bonding technique) can be used to bond the semiconductor dies 115 each other—e.g., by conjoining metallic components (e.g., copper) of adjacent semiconductor dies 115. In such embodiments, individual metallic layers 127 (e.g., copper) of the semiconductor dies 115 can be connected to each other—e.g., with a seam between the individual metallic layers 127. Namely, individual metallic layers 127 of the semiconductor dies 115 can be connected to form a full metal layer around the perimeter of the stack 160.

Each semiconductor die 115 of the stacks 160 can be oriented to have its front side (e.g., the front side 106) facing the interface substrate 165. In other words, the stacks 160 are mounted on the interface substrate 165 such that the front sides 106 of the bottommost semiconductor dies 115 of the stacks 160 face toward the interface substrate 165—e.g., to reduce signal paths between the stacks 160 and the interface substrate 165. Accordingly, the back sides 107 (hence, the dielectric layer 145 of the semiconductor die 115) of the topmost semiconductor dies 115 of the stacks 160 face away from the interface substrate 165. After the topmost and final semiconductor dies 115 have been bonded for all locations on the interface substrate 165 (e.g., a receiving wafer), an encapsulant may be disposed on the interface substrate 165 carrying the stacks 160.

In some embodiments, the surfaces of the topmost semiconductor dies 115 (e.g., the surface of the dielectric layer 145 with the TSVs 140 exposed) may remain exposed after the encapsulant has been disposed—e.g., to fill space between the stacks 160. In other embodiments, the encapsulant encloses the stacks 160, and subsequently, the surfaces of the topmost die can be exposed by removing a portion of the encapsulant over the stacks 160—e.g., using a back grind process, using a CMP process, using an etch back process, or the like. Subsequently, a dielectric layer may be formed on the exposed surface of the stacks 160—e.g., to avoid electrically shorting the TSVs 140, and an additional metallic layer (e.g., a top metallic layer 175 depicted in FIG. 1O) may be formed (e.g., by a PVD process) on the exposed surface of the stacks 160. In this manner, the stacks 160 of the semiconductor die 115 can be provided with full EMI shielding based on the metallic layers 127 around the perimeter of the stack 160 and the top metallic layer 175 over the stacks 160. Thereafter, the interface substrate 165 carrying the stacks 160 of semiconductor dies 115 can be singulated to generate semiconductor die assemblies depicted in FIG. 1O.

Figure 1O:
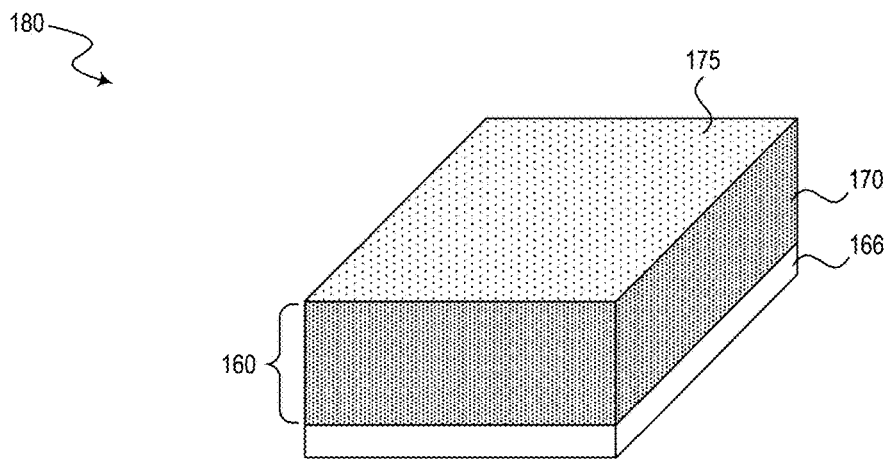

FIG. 1O illustrates a semiconductor die assembly 180 that has been singulated from the interface substrate 165. As such, the semiconductor die assembly 180 includes an interface die 166 (e.g., a controller die, an interposer die)

carrying one of the stacks 160 of the semiconductor dies 115. In some embodiments, the metallic layers 127 around the perimeter of the stack 160 and the top metallic layer 175 over the stack 160 are coupled to a common node (e.g., a ground node) of the semiconductor die assembly 180—e.g., to further improve the EMI shielding. Moreover, the semiconductor die assembly 180 includes the encapsulant 170 extending from the interface die 166 to the topmost semiconductor die 115 of the stack 160, where the encapsulant 170 surrounds the stack 160 of the semiconductor dies 115. In some embodiments, the interface die 166 includes an additional metallic layer at its sidewall around the perimeter of the interface die 166—e.g., using suitable process steps generating the additional metallic layer similar to the process steps described herein.

As described above with reference to FIGS. 1A-1O, the semiconductor dies 115 of the stacks 160 can have a structurally identical configuration—e.g., the semiconductor die 115 described with reference to FIG. 1M. Additional process steps (e.g., process steps forming the top metallic layer 175) can be performed to improve overall EMI shielding characteristics for the stacks 160, after the semiconductor dies 115 have been stacked on the interface substrate 165. Moreover, the present disclosure includes alternative schemes for forming the top metallic layer for the stacks of semiconductor dies as described in more detail below with reference to FIGS. 2A-2E and 3A-3E. The alternative schemes modify aspects of the process steps described with reference to FIGS. 1A-1O to generate semiconductor dies suitable to deploy at the top of the stacks of semiconductor dies. Accordingly, such semiconductor dies (e.g., semiconductor dies 205, semiconductor dies 305) may be referred to as topmost or top semiconductor dies while the semiconductor dies 115 (as depicted in FIG. 1M) may be referred to as core dies or middle dies of the stacks. The top semiconductor dies would have dissimilar features compared to the middle semiconductor dies 115 as described in more detail herein.

Figure 2A:
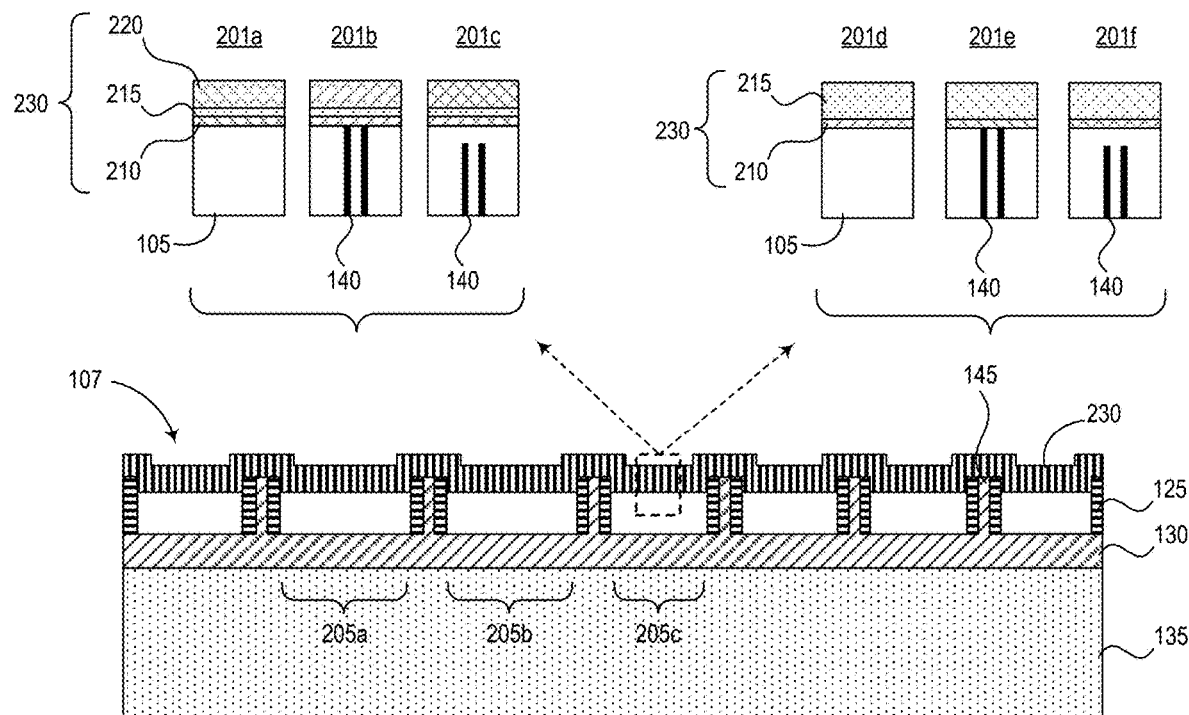
FIGS. 2A through 2E illustrate aspects of a process for semiconductor die edge protection and associated semiconductor die assemblies in accordance with embodiments of the present disclosure.

FIG. 2A illustrates a cross-sectional diagram of the semiconductor dies 205 (e.g., the semiconductor dies 205a-c) attached to the carrier substrate 135, after a second composite layer 230 has been formed on the back side 107. The diagram of FIG. 2A includes features generally similar to those of the diagram of FIG. 1H. Further, the diagram of FIG. 2A includes dissimilar features compared to FIG. 1H, such as the composite layer 230 in lieu of the dielectric layer 145. In some embodiments, the semiconductor dies 205 are structurally identical to the semiconductor dies 115—e.g., to maintain synergy between the process flows for fabricating the middle semiconductor dies and the top semiconductor dies. In some embodiments, the semiconductor dies 205 do not include the TSVs (e.g., the TSVs 140). Moreover, the composite layer 230 may vary as illustrated in cross-sectional diagrams 201a-c and 201d-f of FIG. 2A highlighting the second composite layer 230 and the TSVs 140 or lack thereof.

For example, the diagram 201a depicts the semiconductor die 205 without TSVs in the substrate 105. The composite layer 230 may include a second dielectric layer 210, a second metallic layer 215, and a third dielectric layer 220. The second dielectric layer 210 can be configured to protect the back side 107 of individual semiconductor dies 205 from contaminants (e.g., copper from the second metallic layer 215) and/or during subsequent processing steps. In some embodiments, the second dielectric layer 210 includes an oxide, a nitride, a layer of LNTO, a layer of TEOS, or the like, which can be deposited using CVD or PVD processes or other suitable processes. In some embodiments, the second dielectric layer 210 may be omitted if the second metallic layer 215 includes conductive elements (e.g., W, Ni, etc.) having relatively low diffusion coefficients in the substrate 105.

The diagram 201b depicts the semiconductor die 205 with TSVs (e.g., the TSVs 140, two of which are depicted in the diagram 201b) in the substrate 105. Further, the TSVs can be exposed after completing the recess etch process (e.g., the recess etch process described with reference to FIG. 1G)—e.g., the end portions of the TSVs are uncovered or protruded from the substrate 105. The diagram 201b depicts the composite layer 230 including the second dielectric layer 210, the second metallic layer 215, and the third dielectric layer 220. In view of the TSVs 140 exposed (e.g., after the recess etch process), the second dielectric layer 210 would be required prior to forming the second metallic layer 215 to avoid electrically shorting the TSVs.

The diagram 201c depicts the semiconductor die 205 with TSVs (e.g., the TSVs 140, two of which are depicted in the diagram 201c) in the substrate 105. Further, the composite layer 230 is spaced away from the TSVs—e.g., the TSVs 140 are not exposed after completing the recess etch process. In some embodiments, the trench depth and the recess etch process can be devised such that the end portions of the TSVs 140 are not exposed after the recess etch process while the adhesive material 130 in the trenches 120 (or the portions 128 of the composite layer 125 at the bottom of the trenches 120 as depicted in FIG. 1C) are exposed. The diagram 201c depicts the composite layer 230 including the second dielectric layer 210, the second metallic layer 215, and the third dielectric layer 220. Because the TSVs 140 are not exposed (e.g., after the recess etch process), the second dielectric layer 210 can be omitted—e.g., if the second metallic layer 215 includes conductive elements (e.g., W, Ni, etc.) with relatively low diffusion coefficients in the substrate 105.

In some embodiments, the second composite layer 230 may include the second dielectric layer 210 and the second metallic layer 215 as depicted in the diagrams 201d through 201f—i.e., the third dielectric layer 220 is omitted. In some embodiments, the second dielectric layer 210 can be omitted for the semiconductor dies 205 depicted in the diagrams 201c and 201f for the reasons discussed above with reference to the diagrams 201a and 201c.

Figure 2B:
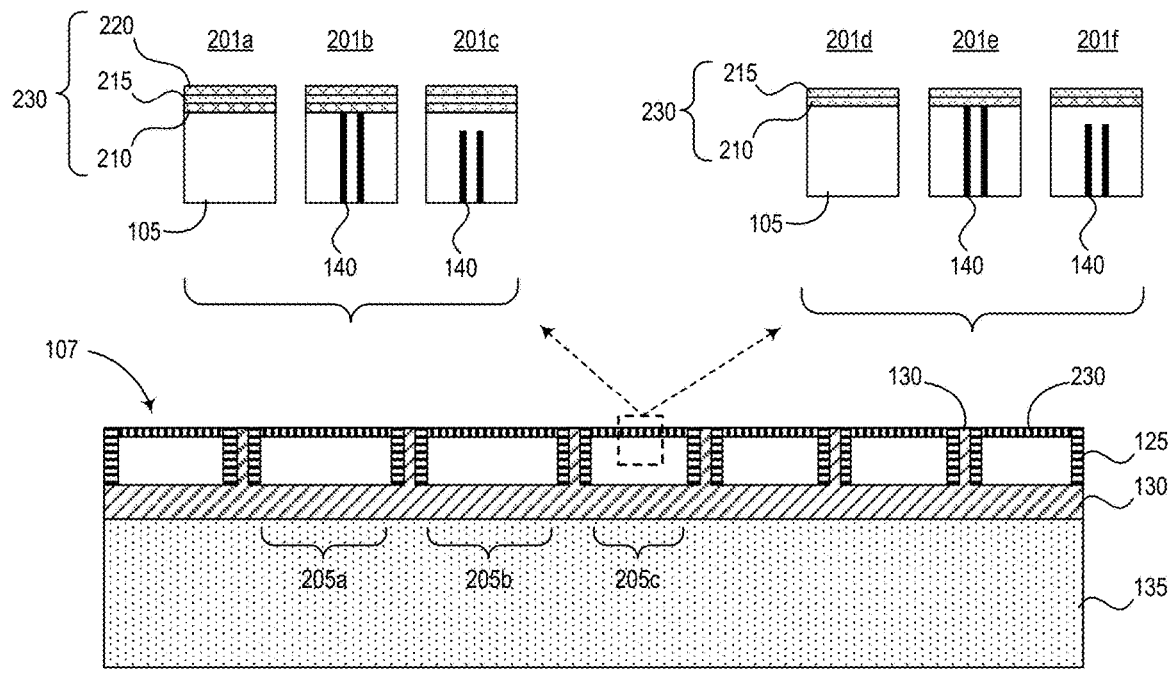

FIG. 2B illustrates a cross-sectional diagram of the semiconductor dies 205 (e.g., the semiconductor dies 205a-c) attached to the carrier substrate 135, after a portion of the composite layer 230 has been removed. In some embodiments, a CMP process can be utilized to remove the portion of the composite layer 230 over the trenches (e.g., regions corresponding to the scribe lines), and to leave a remaining portion of the composite layer 230 on the back side 107 of the semiconductor dies 205. As described with reference to FIG. 1I, the CMP process can be devised to expose the adhesive material 130 (and/or to remove the portions 128 of the composite layer 125 described with reference to the diagram 101 of FIG. 1C such that the semiconductor dies 205 are separated from each other—e.g., singulated) for the subsequent process steps.

Referring to the semiconductor dies 205 depicted in the diagrams 201a-c of FIG. 2B, in some embodiments, the CMP process may be devised to remove a dielectric material (e.g., oxide/nitride CMP processes)—e.g., to remove at least a portion of the third dielectric layer 220. Further, the CMP process may include steps devised to remove a metallic material (e.g., copper, tungsten, nickel, etc.)—e.g., to remove the second metallic layer 215 over the trench regions. As depicted in the diagrams 201a-c of FIG. 2B, the remaining portion of the composite layer 230 at the back side 107 may include the second metallic layer 215 embedded between the second dielectric layer 210 and the third dielectric layer 220. In some embodiments, the second dielectric layer 210 may be omitted for the reasons discussed above.

Referring to the semiconductor dies 205 depicted in the diagrams 201d-f of FIG. 2B, in some embodiments, the CMP process may be devised to remove a metallic material (e.g., metallic CMP processes removing copper, tungsten, nickel, etc.)—e.g., to remove at least a portion of the second metallic layer 215. Further, the CMP process may include steps to remove a dielectric material (e.g., oxide, nitride, etc.)—e.g., to remove the second dielectric layer 210 over the trench regions. As depicted in the diagrams 201d-f of FIG. 2B, the remaining portion of the composite layer 230 at the back side 107 may include the second metallic layer 215 at the back side 107 of semiconductor dies 205. In some embodiments, the second dielectric layer 210 may be omitted for the reasons discussed herein.

Figure 2C:
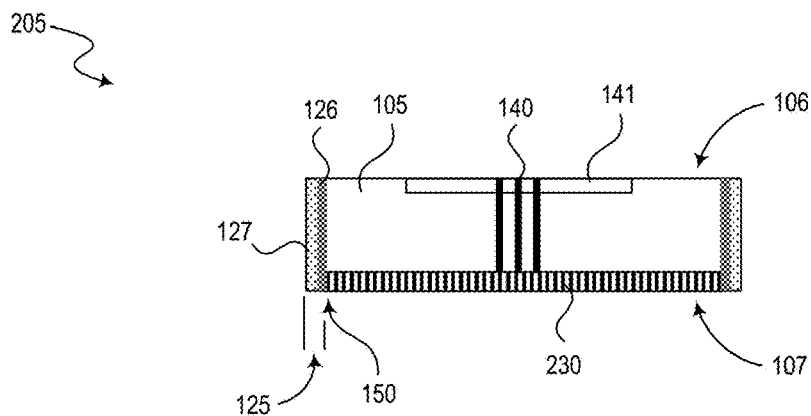

FIG. 2C is a cross-sectional diagram of the semiconductor die 205 after completing subsequent process steps—e.g., the process steps described with reference to FIGS. 1J through 1L. The semiconductor die 205 may be referred to as a top or topmost semiconductor die, in comparison to a middle or core semiconductor die of a semiconductor die assembly—e.g., the semiconductor die 115 described with reference to FIG. 1M. The semiconductor die 205 includes features generally similar those of the semiconductor die 115. For example, the semiconductor die 205 includes the integrated circuitry 141 at the front side 106, and the metallic layer 127 at the sidewall of the semiconductor die 205 extending from the front side 106 to the back side 107. Also, the metallic layer 127 surrounds the sidewall of the semiconductor die 205 such that the metallic layer 127 completely covers the sidewall—e.g., from the front side 106 to the back side 107, as well as from end to end of the outer edges of the semiconductor die 205. Further, the semiconductor die 205 may include the diffusion barrier 126 at the sidewall such that the metallic layer 127 is not in direct contact with the substrate 105 of the semiconductor die 205. In some embodiments, the semiconductor die 205 also includes one or more vias 140 (e.g., TSVs) coupled to the integrated circuitry 141. In other embodiments, the semiconductor die 205 does not include the vias 140.

The semiconductor die 205 includes the second composite layer 230 at the back side 107. Although the composite layer 230 (and the TSVs 140 or lack thereof) may vary as described in detail with reference to the cross-sectional diagrams 201a-c and 201d-f of FIGS. 2A and 2B, the second composite layer 230 includes a metallic layer (e.g., the second metallic layer 215) described with reference to FIGS. 2A and 2B. In some embodiments, the second metallic layer 215 is not connected to the metallic layer 127. In other embodiments, the second metallic layer 215 can be connected to the metallic layer 127. For example, dielectric materials present at the metallic layer 127 (e.g., the diffusion barrier 126, the second dielectric layer 210) can be removed (e.g., using a wet chemistry) prior to forming the second metallic layer 215 such that the second metallic layer 215 is connected to the metallic layer 127 while the second metallic layer 215 is formed. If the semiconductor die 205 is deployed as a top semiconductor die on top of a stack of the middle dies (e.g., the semiconductor dies 115 of FIG. 1M) to form a semiconductor die assembly, the second metallic layer 215 in combination with the metallic layers 127 around the perimeter of the stack can provide for full EMI shielding for the semiconductor die assembly.

Figure 2D:
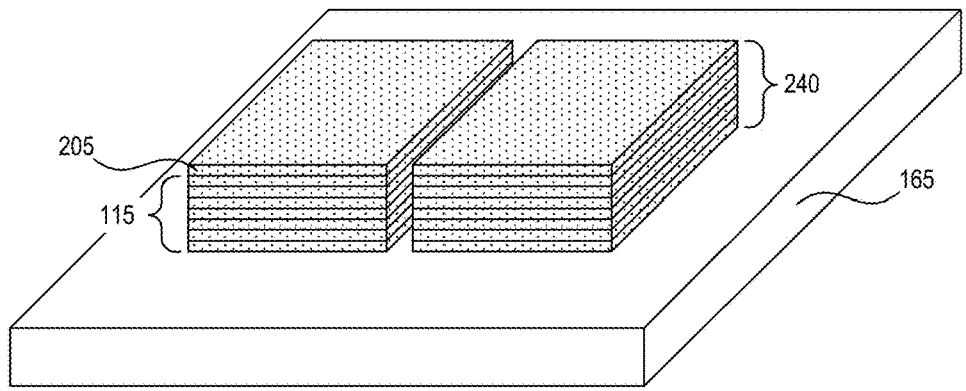

FIG. 2D illustrates stacks 240 of semiconductor dies formed on the interface substrate 165. Each stack 240 includes a stack of semiconductor dies 115 (middle semiconductor dies) and a semiconductor die 205 (a top semiconductor die) on top of the semiconductor dies 115. As described herein, in some embodiments, the stacks 240 are formed by bonding the semiconductor dies (e.g., the semiconductor dies 115, the semiconductor die 205) using a TCB process including intermediary structures. In such embodiments, individual metallic layers 127 of the semiconductor dies are not connected to each other. Namely, adjacent metallic layers of the semiconductor dies are separated by a gap. In some embodiments, a combination bonding (e.g., a hybrid bonding technique, a direct bonding technique) is used to bond the semiconductor dies (e.g., the semiconductor dies 115, the semiconductor die 205) each other—e.g., by conjoining metallic components (e.g., copper) of adjacent semiconductor dies. In such embodiments, the metallic layers (e.g., copper) of the semiconductor dies of the stacks 240 can be connected to each other. Namely, individual metallic layers 127 of the semiconductor dies of the stack 240 can be connected to form a full metal layer around the perimeter of the stack 240.

Each semiconductor dies of the stack 240 may have its front side (e.g., the front side 106) facing the interface substrate 165. As such, the second metallic layer 215 of the top semiconductor die 205 can be located at the top surface of the stack 240 (or underneath the third dielectric layer 220), which is opposite to the interface substrate 165. Accordingly, the stack 240 can be provided with full EMI shielding capability based on the second metallic layer 215 at (or near) the top surface of the stack 240 in combination with the metallic layers 127 around the perimeter of the stack 240.

After the top semiconductor dies 205 have been bonded on top of the stacks of middle dies 115 for all locations on the interface substrate (e.g., a receiving wafer), an encapsulant may be disposed on the interface substrate 165 carrying the stacks 240 of the semiconductor dies—e.g., to fill space between the stacks 160. In some embodiments, the surfaces of the topmost semiconductor dies 205 (e.g., the surface of the second composite layer 230 including the second metallic layer 215) may remain exposed after the encapsulant has been disposed. In other embodiments, the encapsulant 170 encloses the stacks 240. In some embodiments, the surfaces of the topmost dies (e.g., the surface of the second composite layer 230 of the top die 205) may be exposed by removing a portion of the encapsulant 170 over the stacks 240—e.g., using a back grind process, using a CMP process, using an etch back process, or the like. Thereafter, the interface substrate 165 carrying the stacks 240 of semiconductor dies 115 and 205 can be singulated to generate semiconductor die assemblies depicted in FIG. 2E.

Figure 2E:
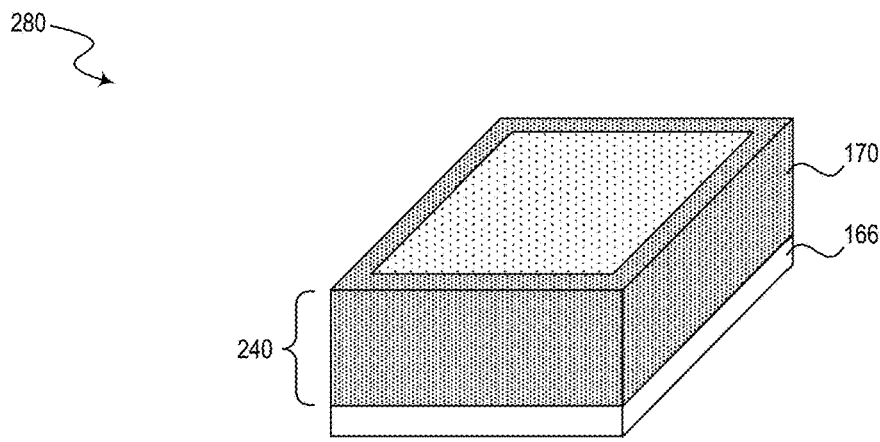

FIG. 2E illustrates a semiconductor die assembly 280 that has been singulated from the interface substrate 165. The semiconductor die assembly 280 includes certain features generally similar to those of the semiconductor die assembly 180. For example, the semiconductor die assembly 280 includes the interface die 166 carrying one of the stacks 240 of the semiconductor dies 115 and 205. In some embodiments, the metallic layers 127 around the perimeter of the stack 240 and the second metallic layer 215 of the top semiconductor die 205 are coupled to a common node (e.g., a ground node) of the semiconductor die assembly 280—e.g., to further improve the EMI shielding. Moreover, the semiconductor die assembly 280 includes the encapsulant 170 extending from the interface die 166 to the topmost semiconductor die 205 of the stack 240, where the encapsulant 170 surrounds the stack 240 of semiconductor dies 115 and 205.

Figure 3A:
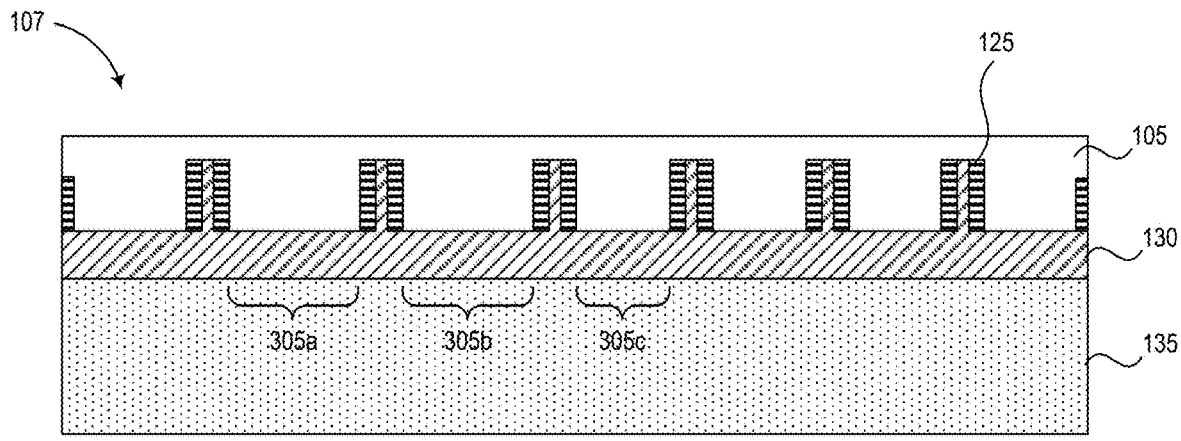
FIGS. 3A through 3E illustrate aspects of a process for semiconductor die edge protection and associated semiconductor die assemblies in accordance with embodiments of the present disclosure.

FIG. 3A illustrates a cross-sectional diagram of the substrate 105 attached to the carrier substrate 135, after a portion of the substrate 105 has been removed from the back side 107. The substrate 105 includes semiconductor dies 305 (e.g., the semiconductor dies 305a-c). The diagram of FIG. 3A includes features generally similar those of the diagram of FIG. 1F. In some embodiments, the semiconductor dies 305 are structurally identical to the semiconductor dies 115. In other embodiments, the semiconductor dies 305 do not include the TSVs (e.g., the TSVs 140).

Figure 3B:
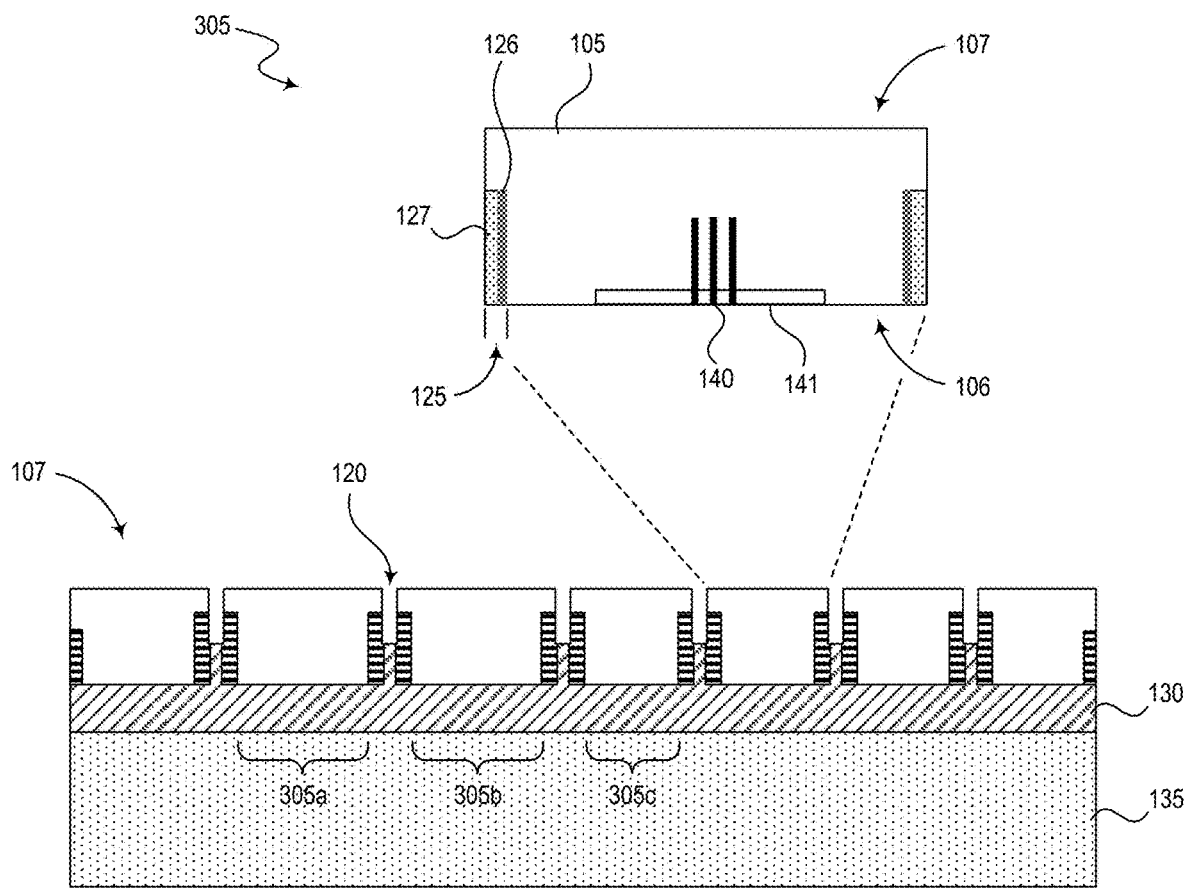

FIG. 3B illustrates a cross-sectional diagram of the substrate 105 attached to the carrier substrate 135, after a dicing process is performed to singulate individual semiconductor dies 305. The dicing process can be devised to physically sever individual semiconductor dies 305 from the substrate 105 along the scribe lines corresponding to the trenches 120, and to expose the adhesive material 130 in the trenches 120 for the subsequent process steps. Further, the dicing process can remove the portions 128 of the composite layer 125 at the bottom of the trenches 120 described with reference to the diagram 101 of FIG. 1C. Subsequently, additional process steps can be performed for the semiconductor dies 305—e.g., the process steps described with reference to FIG. 1J through 1L. The semiconductor die 305 may be referred to as a top/topmost semiconductor die, in comparison to a middle die (a core die) of a semiconductor die assembly—e.g., the semiconductor die 115 described with reference to FIG. 1M.

Figure 3C:
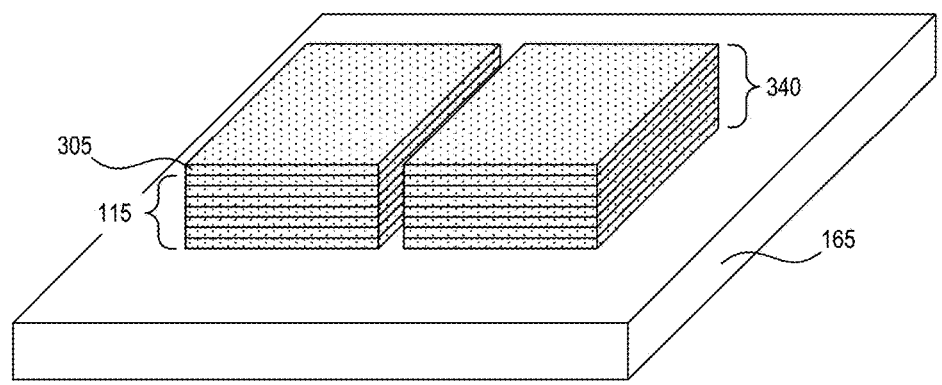

FIG. 3C illustrates stacks 340 of semiconductor dies formed on the interface substrate 165. Each stack 340 includes a stack of semiconductor dies 115 (middle dies) and a semiconductor die 305 (as depicted in FIG. 3B) on top of the stack of semiconductor dies 115. The semiconductor dies of the stacks 340 are mounted on the interface substrate 165 such that the front sides 106 of the semiconductor dies of the stacks 340 face toward the interface substrate 165. Accordingly, the back sides 107 of the topmost semiconductor dies 305 face away from the interface substrate 165.

As described herein, in some embodiments, the stacks 340 are formed by bonding the semiconductor dies (e.g., the semiconductor dies 115, the semiconductor die 305) using the TCB process including intermediary structures. In such embodiments, individual metallic layers 127 of the semiconductor dies of the stack 340 are not connected to each other. Namely, adjacent metallic layers 127 of the semiconductor dies of the stack 340 are separated by a gap. In some embodiments, a combination bonding (e.g., a hybrid bonding technique, a direct bonding technique) is used to bond the semiconductor dies (e.g., the semiconductor dies 115, the semiconductor die 305) each other—e.g., by conjoining metallic components (e.g., copper) of adjacent semiconductor dies. In such embodiments, the metallic layers 127 (e.g., copper) of the semiconductor dies of the stacks 340 can be connected to each other. Namely, individual metallic layers 127 of the semiconductor dies of the stack 340 can be connected to form a full metal layer around the perimeter of the stack 340.

In some embodiments, after the topmost and final semiconductor dies 305 have been bonded for all locations on the interface substrate (e.g., a receiving wafer), an encapsulant may be disposed on the interface substrate 165 carrying the stacks 340 of the semiconductor dies. In some embodiments, the encapsulant encloses the stacks 340, and subsequently, the surface of the topmost die 305 (e.g., the back side 107 of the semiconductor die 305 as depicted in FIG. 3B) may be exposed by removing a portion of the encapsulant over the stacks 340—e.g., using a back grind process, using a CMP process, using an etch back process, or the like. In some embodiments, the substrate 105 of the top semiconductor dies 305 may be further thinned down to the first metallic layer 127 of the semiconductor dies 305 as depicted in the diagram 301a of FIG. 3E. In other embodiments, the substrate 105 of the top semiconductor dies 305 may further be thinned down to a final thickness T1 as depicted in the diagram 301b of FIG. 3E, where the final thickness T1 is greater than the depth D of the trenches 120.

Subsequently, a second dielectric layer 310 may be formed on the exposed surface of the back side 107 of the semiconductor die 305. Further, a second metallic layer 315 can be formed (e.g., by a PVD process) on the second dielectric layer 310. In this manner, the stacks 340 of the semiconductor dies can be provided with full EMI shielding based on the metallic layers 127 around the perimeter of the stack 340 and the second metallic layer 315 over the stacks 340. Thereafter, the interface substrate 165 carrying the stacks 340 of semiconductor dies can be singulated to generate the semiconductor die assembly 380 depicted in FIG. 3D.

Figure 3D:
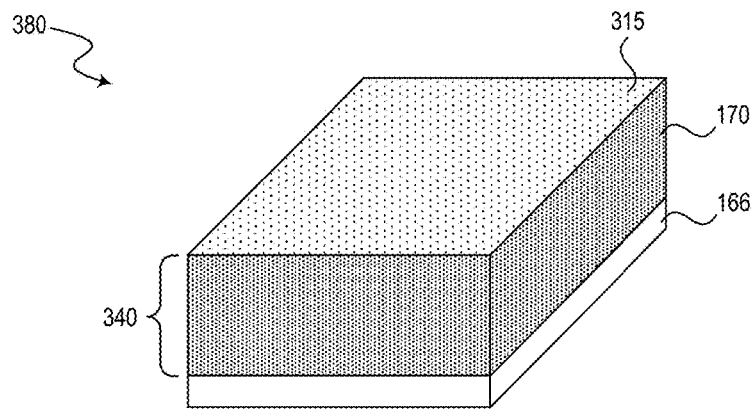

FIG. 3D illustrates the semiconductor die assembly 380 that has been singulated from the interface substrate 165. The semiconductor die assembly 380 includes certain features generally similar to those of the semiconductor die assemblies 180 or 280. For example, the semiconductor die assembly 380 includes the interface die 166 carrying one of the stacks 340 of the semiconductor dies. In some embodiments, the metallic layers 127 around the perimeter of the stack 340 and the second metallic layer 315 over the stack 340 are coupled to a common node (e.g., a ground node) of the semiconductor die assembly 380—e.g., to further improve the EMI shielding. Moreover, the semiconductor die assembly 380 includes the encapsulant 170 extending from the interface die 166 to the topmost semiconductor die 305 of the stack 340, where the encapsulant 170 surrounds the stack 340 of semiconductor dies (e.g., the stack of semiconductor dies 115 and the semiconductor die 305 over the stack of semiconductor dies 115).

Figure 3E:
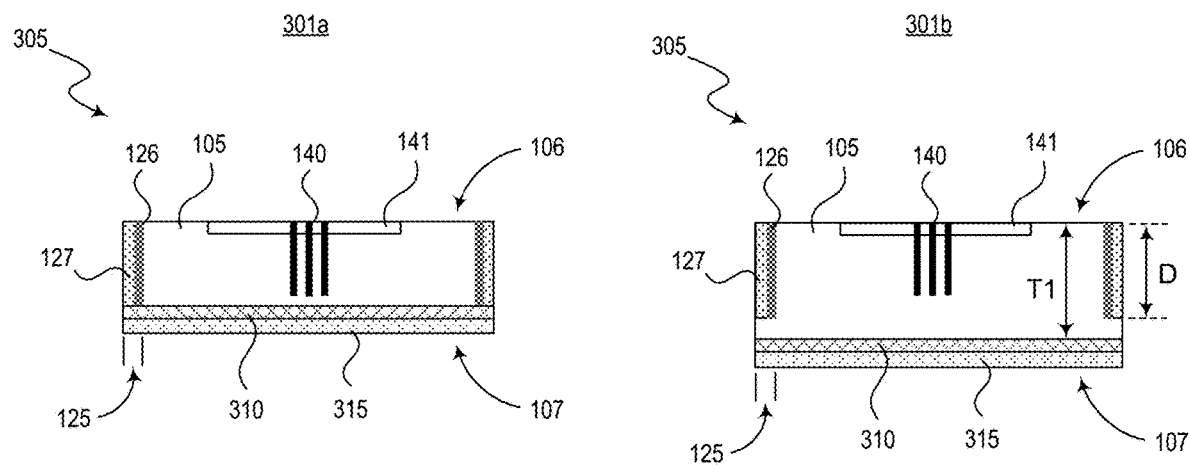

FIG. 3E illustrates cross-sectional diagrams of the semiconductor dies 305 after the second metallic layer 315 has been formed. The semiconductor dies 305 may be referred to as a top or topmost die, in comparison to a middle or core die of a semiconductor die assembly—e.g., the semiconductor die 115 described with reference to FIG. 1M. The semiconductor die 305 includes features generally similar to those of the semiconductor die 115. For example, the semiconductor die 305 includes the integrated circuitry 141 formed at the front side 106, and the metallic layer 127 at the sidewall of the semiconductor die 305. Further, the semiconductor die 305 may include the diffusion barrier 126 at the sidewall such that the metallic layer 127 is not in direct contact with the substrate 105. In some embodiments, the semiconductor die 305 also includes one or more vias 140 (e.g., TSVs) coupled to the integrated circuitry 141. In other embodiments, the vias 140 may be omitted.

The semiconductor die 305 may include the second dielectric layer 310 at the back side 107. Further, the semiconductor die 305 includes the second metallic layer 315 (e.g., one or more metallic layers including copper, tungsten, nickel, or the like) at the back side 107. In some embodiments, the second dielectric layer 310 may be omitted. The semiconductor die 305 of the diagram 301a corresponds to the semiconductor die 305 when the substrate 105 is thinned down to expose the metallic layer 127 as described with reference to FIG. 3C. If the second dielectric layer 310 is omitted, the metallic layer 127 can be connected to the second metallic layer 315. Similarly, the semiconductor die 305 of the diagram 301b corresponds to the semiconductor die 305 when the substrate 105 is thinned down to have the thickness T1—e.g., the metallic layer 127 is not exposed. In such cases, the metallic layer 127 is not connected to the second metallic layer 315. In some embodiments, the final thickness T1 may be determined based on inputs from the customers.

Figure 4:
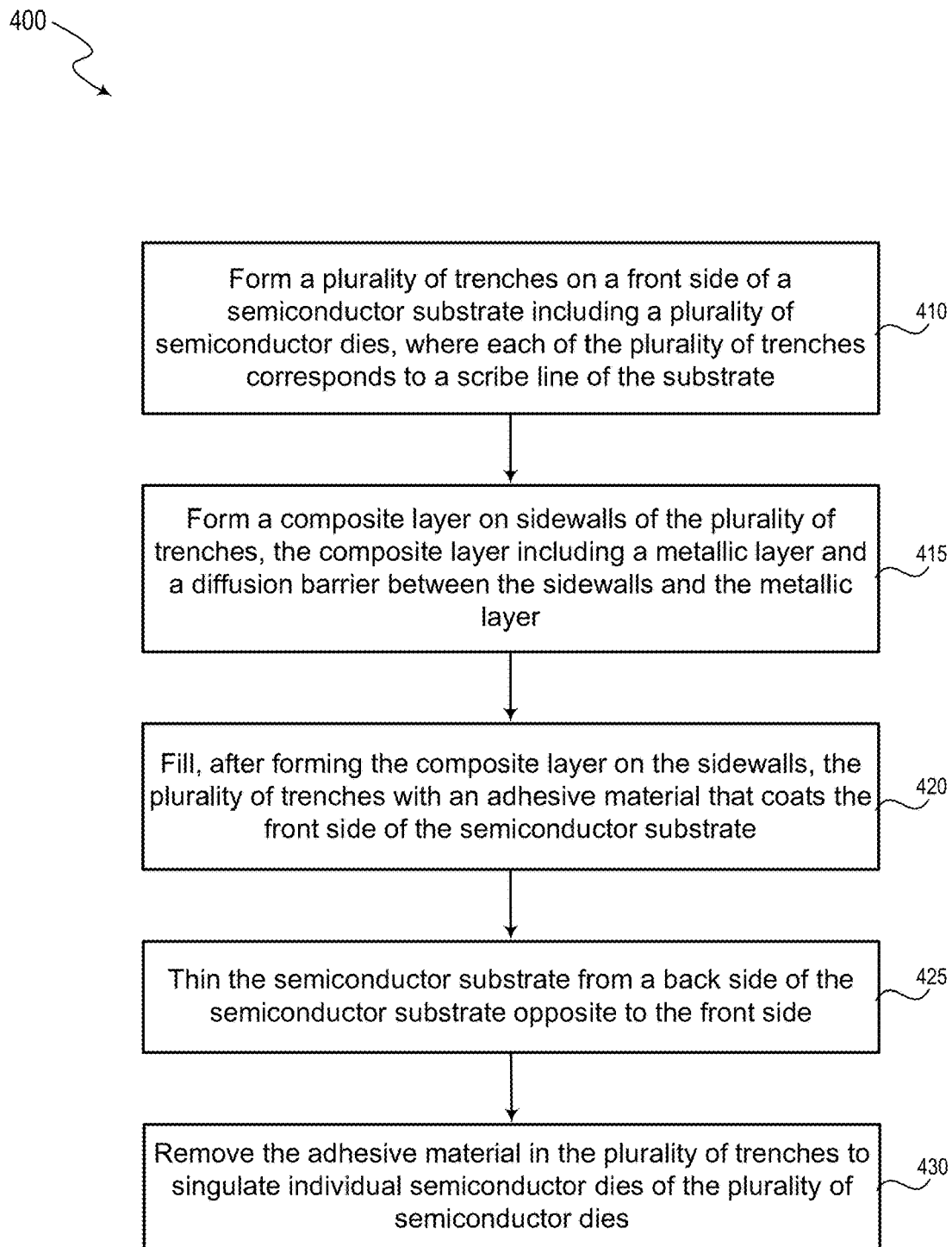
FIG. 4 is a flowchart illustrating a method for semiconductor die edge protection and associated semiconductor die assemblies in accordance with embodiments of the present disclosure.

FIG. 4 is a flowchart 400 illustrating a method of protecting edges of semiconductor dies in accordance with an embodiment of the present disclosure. The flowchart 400 may include aspects of methods as described with reference to FIGS. 1A through 3E.

The method includes forming a plurality of trenches on a front side of a semiconductor substrate including a plurality of semiconductor dies, wherein each of the plurality of trenches corresponds to a scribe line of the substrate (box 410). The method further includes forming a composite layer on sidewalls of the plurality of trenches, the composite layer including a metallic layer and a diffusion barrier between the sidewalls and the metallic layer (box 415). The method further includes filling, after forming the composite layer on the sidewalls, the plurality of trenches with an adhesive material that coats the front side of the semiconductor substrate (box 420). The method further includes thinning the semiconductor substrate from a back side of the semiconductor substrate opposite to the front side (box 425). The method further includes removing the adhesive material in the plurality of trenches to singulate individual semiconductor dies of the plurality of semiconductor dies (box 430).

In some embodiments, forming the composite layer on the sidewalls further comprises forming the diffusion barrier on the sidewalls of the plurality of trenches and on the front side of the semiconductor substrate, forming the metallic layer on the diffusion barrier, and removing the metallic layer and the diffusion barrier from the front side of the semiconductor substrate. In some embodiments, thinning the semiconductor substrate from the back side corresponds to thinning the semiconductor substrate to less than a depth of the trenches. In some embodiments, the method further includes forming, prior to removing the adhesive material in the plurality of trenches, a second metallic layer at the back side of the semiconductor substrate that has been thinned. In some embodiments, the method further includes stacking one or more semiconductor dies of the plurality of semiconductor dies on an interface die, wherein individual semiconductor dies of the plurality of semiconductor dies have been singulated based, at least in part, on removing the adhesive material in the plurality of trenches, and forming a second metallic layer on a topmost semiconductor die of the one or more semiconductor dies that have been stacked.

Figure 5:
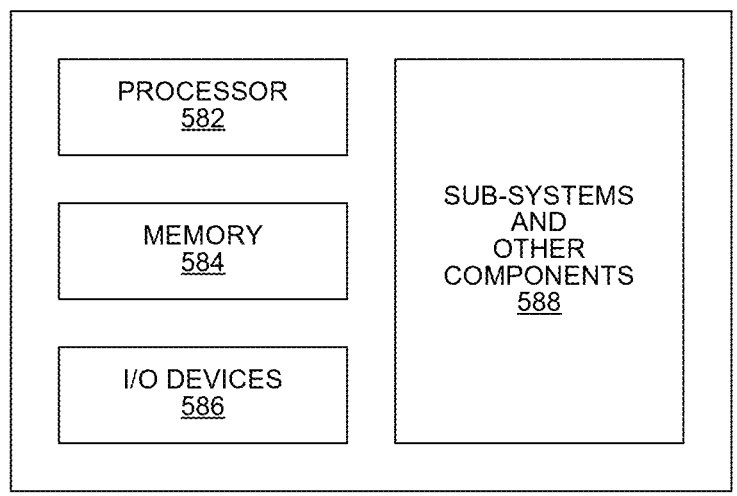
FIG. 5 is a schematic view of a system that includes a semiconductor device assembly in accordance with embodiments of the present disclosure.

The semiconductor dies described in detail above with reference to FIGS. 1A through 4 (e.g., semiconductor dies 115, 205, and/or 305) or packages incorporating such semiconductor devices (e.g., semiconductor device assemblies 180, 280, and/or 380) can be incorporated into any of a myriad of larger and/or more complex systems, a representative example of which is a system 580 shown schematically in FIG. 5. The system 580 can include a processor 582, a memory 584 (e.g., SRAM, DRAM, flash, 3D NAND, 3D cross-point and/or other memory devices), input/output devices 586, and/or other subsystems or components 588.

For example, the memory 584 may include a semiconductor die assembly including an interface die and a stack of semiconductor dies over the interface die, where each semiconductor die of the stack includes a metallic layer surrounding a sidewall of the semiconductor die. In some embodiments, a topmost semiconductor die of the stack includes a second metal layer that is parallel with the interface die.

In some embodiments, adjacent metallic layers of the semiconductor dies are separated by a gap. In other embodiments, at least two metallic layers of the semiconductor dies are connected to each other. Further, each semiconductor die of the stack may further include a diffusion barrier between the sidewall and the metallic layer, where the diffusion barrier is configured to block one or more metallic constituents of the metallic layer from diffusing into a semiconductor substrate of the semiconductor die. In this manner, the semiconductor die assembly may have improved reliability performance and superior thermal transfer properties throughout the semiconductor die assembly due to the protective layer (e.g., the metallic layer surrounding the sidewall), as well as EMI shields for the semiconductor die assembly.

The resulting system 580 can be configured to perform any of a wide variety of suitable computing, processing, storage, sensing, imaging, and/or other functions. Accordingly, representative examples of the system 580 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 580 include lights, cameras, vehicles, etc. With regard to these and other example, the system 580 can be housed in a single unit or distributed over multiple interconnected units, for example, through a communication network. The components of the system 580 can accordingly include local and/or remote memory storage devices and any of a wide variety of suitable computer-readable media.

It should be noted that the methods described above describe possible implementations, and that the operations and the steps may be rearranged or otherwise modified and that other implementations are possible. Furthermore, embodiments from two or more of the methods may be combined.

From the foregoing, it will be appreciated that specific embodiments of the technology have been described herein for purposes of illustration, but that various modifications may be made without deviating from the disclosure. For example, although the foregoing example process sequence illustrates the first process (e.g., the back grind process) achieving the results depicted in FIG. 1F and the second process (e.g., the etch process) achieving the results depicted in FIG. 1G as two separate process steps utilizing two different process modules (e.g., the back grind process module and etch process module), the present disclosure is not limited thereto. Namely, process steps to thin the substrate 105 to expose the adhesive material 130 (and the TSVs 140) from the back side 107 may be performed without using two different process modules.

For example, a CMP process module may be utilized. In this regard, after removing the bulk of the substrate 105 using the CMP process to achieve the results depicted in FIG. 1F (e.g., based on a total CMP process time using a previously established substrate removal rate), various process parameters for the CMP process may be modified (e.g., using a different slurry, changing pressures associated with a wafer chuck and/or a stage of the CMP tool, tweaking rotation speeds/directions of the wafer chuck and/or the stage, etc.) to reduce the substrate removal rate such that the CMP process may continue to remove the substrate 105 with a fine-tuned removal rate to expose the adhesive material 130 to achieve the results depicted in FIG. 1G, thereby without switching to an etch process. Additionally, or alternatively, the CMP process may utilize an endpoint mechanism based on detecting a change in friction monitored by a motor of the CMP tool when the composite layer 125 and the adhesive material 130 is exposed. Such an endpoint mechanism may indicate that the CMP process has reached to the bottom of trenches 120 from the back side 107, at least in certain areas of the substrate 105 such that the CMP process can be fine-tuned thereafter to precisely control the removal rate. In addition, certain aspects of the present disclosure described in the context of particular embodiments may also be combined or eliminated in other embodiments.

The devices discussed herein, including a semiconductor device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an example step that is described as "based on condition A" may be based on both a condition A and a condition B without departing from the scope of the present disclosure. In other words, as used herein, the phrase "based on" shall be construed in the same manner as the phrase "based at least in part on."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present disclosure. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present disclosure.

What is claimed is:

1. A method comprising:
forming a plurality of trenches on a front side of a semiconductor substrate including a plurality of semiconductor dies, wherein each of the plurality of trenches corresponds to a scribe line of the substrate;
forming a composite layer on sidewalls of the plurality of trenches, the composite layer including a metallic layer and a diffusion barrier between the sidewalls and the metallic layer;
filling, after forming the composite layer on the sidewalls, the plurality of trenches with an adhesive material that coats the front side of the semiconductor substrate;
thinning the semiconductor substrate from a back side of the semiconductor substrate opposite to the front side; and
removing the adhesive material in the plurality of trenches to singulate individual semiconductor dies of the plurality of semiconductor dies.

2. The method of claim 1, wherein forming the composite layer on the sidewalls further comprises:
forming the diffusion barrier on the sidewalls of the plurality of trenches and on the front side of the semiconductor substrate;
forming the metallic layer on the diffusion barrier; and
removing the metallic layer and the diffusion barrier from the front side of the semiconductor substrate.

3. The method of claim 1, wherein thinning the semiconductor substrate from the back side corresponds to thinning the semiconductor substrate to less than a depth of the trenches.

4. The method of claim 1, further comprising:
forming, prior to removing the adhesive material in the plurality of trenches, a second metallic layer at the back side of the semiconductor substrate that has been thinned.

5. The method of claim 1, further comprising:
stacking one or more semiconductor dies of the plurality of semiconductor dies on an interface die, wherein individual semiconductor dies of the plurality of semiconductor dies have been singulated based, at least in part, on removing the adhesive material in the plurality of trenches; and
forming a second metallic layer on a topmost semiconductor die of the one or more semiconductor dies that have been stacked.

6. The method of claim 1, wherein:
the diffusion barrier comprises at least one of silicon nitride, tantalum, or tantalum nitride; and
the metallic layer comprises copper.

7. The method of claim 1, wherein:
the metallic layer completely covers outermost sidewalls of each of the singulated individual semiconductor dies.

8. A method comprising:
forming a plurality of trenches on a front side of a semiconductor substrate including a plurality of semiconductor dies, wherein each of the plurality of trenches corresponds to a scribe line of the substrate;
forming a composite layer on sidewalls of the plurality of trenches, the composite layer including a first metallic layer and a diffusion barrier between the sidewalls and the first metallic layer;
filling, after forming the composite layer on the sidewalls, the plurality of trenches with a sacrificial material;
thinning the semiconductor substrate from a back side of the semiconductor substrate opposite to the front side;

forming a second metallic layer at the back side of the semiconductor substrate that has been thinned and removing the sacrificial material in the plurality of trenches to singulate individual semiconductor dies of the plurality of semiconductor dies.

9. The method of claim 8, wherein forming the composite layer on the sidewalls further comprises:

forming the diffusion barrier on the sidewalls of the plurality of trenches and on the front side of the semiconductor substrate;

forming the first metallic layer on the diffusion barrier; and removing the first metallic layer and the diffusion barrier from the front side of the semiconductor substrate.

10. The method of claim 8, wherein thinning the semiconductor substrate from the back side corresponds to thinning the semiconductor substrate to less than a depth of the trenches.

11. The method of claim 8, further comprising:

stacking one or more semiconductor dies of the plurality of semiconductor dies on an interface die, wherein individual semiconductor dies of the plurality of semiconductor dies have been singulated based, at least in part, on removing the sacrificial material in the plurality of trenches; and forming a second metallic layer on a topmost semiconductor die of the one or more semiconductor dies that have been stacked.

12. The method of claim 8, wherein:

the diffusion barrier comprises at least one of silicon nitride, tantalum, or tantalum nitride; and the metallic layer comprises copper.

13. The method of claim 8, wherein:

the first metallic layer completely covers outermost sidewalls of each of the singulated individual semiconductor dies.

14. The method of claim 8, wherein:

wherein the first and second metallic layers are directly connected to each other.

* * * * *